US008848336B2

(12) United States Patent
Koutsaroff et al.

(10) Patent No.: US 8,848,336 B2
(45) Date of Patent: Sep. 30, 2014

(54) PEROVSKITE MATERIAL WITH ANION-CONTROLLED DIELECTRIC PROPERTIES, THIN FILM CAPACITOR DEVICE, AND METHOD FOR MANUFACTURING THE SAME

(75) Inventors: Ivoyl Koutsaroff, Nagaokakyo (JP); Shinichi Higai, Nagaokakyo (JP); Akira Ando, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 174 days.

(21) Appl. No.: 13/616,908

(22) Filed: Sep. 14, 2012

(65) Prior Publication Data

US 2013/0003254 A1    Jan. 3, 2013

Related U.S. Application Data

(63) Continuation of application No. PCT/IB2011/000905, filed on Apr. 28, 2011.

(60) Provisional application No. 61/412,893, filed on Nov. 12, 2010, provisional application No. 61/328,720, filed on Apr. 28, 2010.

(51) Int. Cl.
| H01G 4/06 | (2006.01) |
| H01L 49/02 | (2006.01) |
| H01B 3/10 | (2006.01) |
| C01G 23/00 | (2006.01) |
| H01L 21/02 | (2006.01) |
| H01G 7/06 | (2006.01) |

(52) U.S. Cl.
CPC ....... *H01L 21/02266* (2013.01); *C01P 2006/40* (2013.01); *H01L 28/56* (2013.01); *C01P 2002/54* (2013.01); *H01B 3/10* (2013.01); *C01G 23/006* (2013.01); *H01G 7/06* (2013.01); *H01L 21/02197* (2013.01); *C01P 2002/52* (2013.01); *C01P 2002/34* (2013.01)
USPC ............. 361/321.4; 361/321.5; 361/311; 361/313; 361/321.2; 361/306.1; 510/134; 510/135; 510/137; 510/139

(58) Field of Classification Search
USPC ............. 361/321.4, 321.5, 301.2, 301.4, 361/303–305, 311–313, 321.2, 306.3; 501/134, 135, 137, 139
See application file for complete search history.

(56) References Cited

U.S. PATENT DOCUMENTS

| 4,734,390 A | 3/1988 | Marchand et al. |
| 4,888,246 A | 12/1989 | Kuwata et al. |

(Continued)

FOREIGN PATENT DOCUMENTS

| JP | 61-122108 A | 6/1986 |
| JP | 2001-135143 A | 5/2001 |

(Continued)

OTHER PUBLICATIONS

Official Communication issued in International Patent Application No. PCT/IB2011/000905, mailed on Aug. 30, 2011.

(Continued)

*Primary Examiner* — Nguyen T Ha
(74) *Attorney, Agent, or Firm* — Keating & Bennett, LLP

(57) ABSTRACT

A crystalline perovskite crystalline composite paraelectric material includes nano-regions containing rich $N^{3-}$ anions dispersed in a nano-grain sized matrix of crystalline oxide perovskite material, wherein $(ABO_{3-\delta})_\alpha\text{-}(ABO_{3-\delta-\gamma}N_\gamma)_{1-\alpha}$. A represents a divalent element, B represents a tetravalent element, $\gamma$ satisfies $0.005 \leq \gamma \leq 1.0$, $1\text{-}\alpha$ satisfies $0.05 \leq 1\text{-}\alpha \leq 0.9$, and $1\text{-}\alpha$ is an area ratio between the regions containing rich $N^{3-}$ anions and the matrix of remaining oxide perovskite material.

10 Claims, 23 Drawing Sheets

(56) References Cited

U.S. PATENT DOCUMENTS

| | | | |
|---|---|---|---|
| 6,156,259 A * | 12/2000 | Nishizawa et al. | 264/620 |
| 6,620,752 B2 * | 9/2003 | Messing et al. | 501/136 |
| 6,624,462 B1 | 9/2003 | Kohara et al. | |
| 6,645,395 B2 * | 11/2003 | Shindo et al. | 252/62.9 R |
| 6,818,144 B1 * | 11/2004 | Tidrow et al. | 252/62.9 R |
| 7,205,256 B2 * | 4/2007 | Kijima et al. | 502/232 |
| 8,241,519 B2 * | 8/2012 | Luo et al. | 252/62.9 PZ |
| 2006/0214205 A1 | 9/2006 | Baniecki et al. | |
| 2009/0022971 A1 | 1/2009 | Cole | |
| 2009/0069274 A1 | 3/2009 | Sheppard et al. | |
| 2010/0096678 A1 | 4/2010 | Subramanyam | |

FOREIGN PATENT DOCUMENTS

| | | |
|---|---|---|
| JP | 3730840 B2 | 1/2006 |
| JP | 2006-310744 A | 11/2006 |
| JP | 2007-123494 A | 5/2007 |
| JP | 2008-085081 A | 4/2008 |
| JP | 2010-515643 A | 5/2010 |
| WO | 2008/130458 A2 | 10/2008 |

OTHER PUBLICATIONS

Bernacki et al.; "Barium Strontium Titanate Thin-Film Multi-Layer Capacitors," Passive Component Industry Magazine; Sep./Oct. 2004; pp. 11-13.

Kohara et al., "Low-Temperature and High-Rate Deposition of SrTiO3 Thin Films by RF Magnetron Sputtering", Jpn. J. Appl. Phys., vol. 39, Part 1, No. 1, Jan. 2000, pp. 172-177.

Kohara et al., "Improvement of Properties of SrTiO3 Thin Films Deposited at Low Temperature and High Rate by Sputtering Gas", Jpn. J. Appl. Phys., vol. 39, Part 1, No. 6A, Jun. 2000, pp. 3519-3523.

Xia et al., "Enhanced tuning properties of (Ba, Sr)TiO3 bilayer thin films formed by rf magnetron sputtering", J. Phys. D: Appl. Phys., 37, 2004, pp. 2256-2260.

Wang et al., "Dielectric and Ferroelectric Properties of Ba1-xSrxTiO3 Thin Films Prepared by Pulsed Laser Deposition", Key Engineering Materials, vols. 280-283, 2005, pp. 81-84.

Lu et al., "Internal residual stress studies and enhanced dielectric properties in La0.7Sr0.3CoO3 buffered (Ba,Sr) TiO3 thin films", J. Appl. Phys., 106, 2009, pp. 064107-1-064107-5.

Zerkout et al., "TiN—Fe nanocomposite thin films deposited by reactive magnetron sputtering", J. Phys. D: Appl. Phys., 40, 2007, pp. 7508-7514.

Caracas et al., "Prediction of polar ordered oxynitride perovskites", Appl. Phys. Letters, 91, 2007, pp. 092902-1-09290-3.

Hosokura et al., "Fabrication and Characterization of a (100) Three-Axis-Oriented Single-Crystal (Ba0.7Sr0.3)TiO3 Thin Film Prepared by the Chemical Solution Deposition Method", J. Am. Ceram. Soc., 92, 2009, pp. 253-255.

Kassem et al., "LaTiOxNy Thin Films, Measurement and Application to Microwave Device", Proceedings of the 38th European Microwave Conference, Oct. 2008, pp. 1362-1365.

Zhong et al., "Highly tunable and temperature insensitive multilayer barium strontium titanate films", Appl. Phys. Letters., 90, 2007, pp. 092901-1-092901-3.

Higai, "Quest for New Possibilities for Ceramic Deilectric Materials by Using calculational Science Techniques", Bulletin of the Ceramic Society of Japan, vol. 46, No. 6, 2011, pp. pp. 495-499.

Shkabko et al., "Synthesis and transport properties of SrTiO3-xNy/SrTiO3-δlayered structures produced by microwave-induced plasma nitridation", J. Phys. D: Appl. Phys., 42, 2009, pp. 145202-1-145202-9.

Official Communication issued in corresponding Japanese Patent Application No. 2013-505565, mailed on Apr. 1, 2014.

* cited by examiner $Ba_4Sr_4Ti_8O_{24-x}N_x$ $Ba_4Sr_4Ti_8O_{24}$
Tetragonal
$dr = 0.0623$ Å
$c/a = 1.0046$
$dE = -0.0268$ eV $Ba_4Sr_4Ti_8O_{23}N_1$
Tetragonal
$dr = 0.1569$ Å
$c/a = 1.0127$ $Ba_4Sr_4Ti_8O_{16}N_8$
Tetragonal
$dr = 0.3643$ Å
$c/a = 1.3392$
$dE = -1.0345$ eV Ba, Sr, Gd, Ca ● O ● N ● Ti, Zr, Ge  $(Ba_{1-x-y-z}Sr_xGd_yCa_z)(Ti_{1-w-v}Zr_wGe_v)O_{3-\delta}N_\delta$

| Theoretical | N atom % | tetragonality | Volume | Quasicubic $a_c$ (Å) | a (Å) | c (Å) |
|---|---|---|---|---|---|---|
| Ba0.5Sr0.5TiO3 | 0 | 1.004570 | 62.2887 | 3.964025 | 3.958005 | 3.976092 |
| Ba0.5Sr0.5TiO2.875N0.125 | 2.5641 | 1.012743 | 63.64361 | 3.992561 | 3.975745 | 4.026408 |
| Ba0.5Sr0.5TiO2.75N0.25 | 5.2632 | 1.031941 | 65.46212 | 4.030232 | 3.988214 | 4.1156 |
| Ba0.5Sr0.5TiO2.625N0.375 | 8.1081 | 1.057969 | 67.42129 | 4.070043 | 3.994306 | 4.225853 |
| Ba0.5Sr0.5TiO2.5N0.5 | 11.1111 | 1.246479 | 74.38201 | 4.205548 | 3.907758 | 4.870938 |

| | Binding Energy [eV] for the core levels | Normalized concentrations | |
|---|---|---|---|
| Ti2 p3/2 | 457.6 | 0.97 | $TiO_2$ ($Ti^{4+}$) |
| N 1s | 395.0 | 0.024 | N-Ti<br>N-(Ba,Sr) |
| N 1s | 404.3 | 0.002 | N-N, N |

PEROVSKITE MATERIAL WITH ANION-CONTROLLED DIELECTRIC PROPERTIES, THIN FILM CAPACITOR DEVICE, AND METHOD FOR MANUFACTURING THE SAME

BACKGROUND OF THE INVENTION

1. Field of the Invention

The present invention relates to thin film materials, suitable for ferroelectric tunable devices and/or decoupling thin film capacitors based on such materials, and methods of manufacturing thin film devices, and more particularly, to paraelectric perovskite oxynitride nanocomposite materials and methods of making such materials for use in forming varactor devices with improved voltage tunabilities and high capacitance density thin film decoupling capacitors.

2. Description of the Related Art

In order to achieve maximum tunability of a ferroelectric varactor, a maximum voltage must be applied to induce a change in the dielectric constant needed to produce the maximum possible shift in capacitance. FIG. 1 illustrates an example of a typical tunability achieved with a ferroelectric varactor using a thin-film ferroelectric material, such as (Ba,Sr)TiO$_3$. FIG. 1 corresponds to FIG. 7 of U.S. 2009/0069274.

U.S. 2009/0069274 discloses a tunability of 2.8:1 under an electric field of 450 kV/cm to 500 kV/cm or a 70% reduction of the original capacitance under a 450 kV/cm bias field as shown in FIG. 1. Additional examples reported typical tunabilities for 100 nm to 200 nm thick (Ba,Sr)TiO$_3$ (BST) films used in parallel plate Pt/BST/Pt MIM type variable capacitors (varactors) in the range of 4:1 at 11 Volts (see, for example, FIG. 5 of U.S. 2007/0069274) to 6.3:1 at 10 Volts as shown in FIG. 2, which corresponds to FIG. 5 of T. Bernacki, I. Koutsaroff, and C. Divita, "Barium Strontium Titanate Thin-Film Multi-Layer Capacitors", Passive Component Industry Magazine, September/October 2004, pp. 11-13.

Oxynitrides perovskites can often be described as derivatives of oxides, formed by simultaneous substitutions (charge equivalency (balance) rule) of cation and anion components. The higher anionic charge resulting from the $N^{3-}/O^{2-}$ substitution can be compensated according to two different principles. In the first case, a cross-substitution is applied with trivalent $RE^{3+}$ (rare earth) elements as suitable substitutes, for instance, for divalent alkaline-earth cations. For example, the oxynitride "charge balance equivalent" to BaTiO$_3$ will be LaTiO$_2$N$_1$, or NdTiO$_2$N$_1$. Another example for charge compensation in AB(ON)$_3$ oxynitrides perovskites, is simultaneous substitution of the Ti$^{4+}$ with Me$^{5+}$ and partial substitution of O$^{2-}$ sites with N$^{3-}$ so as to convert the perovskite oxide BaTiO$_3$ into the oxynitride perovskites, such as BaTaO$_2$N or BaNbO$_2$N, in addition to LaTaON$_2$.

The incorporation of $N^{3-}/N^{2-}$ into oxygen anion sites of the perovskite oxides results in pronounced structural effects, such as an elongated Ti(Zr)—N bond length and the reduced electronegativity of the nitride ion N$^{3-}$, with respect to the oxide ion O$^{2-}$, which will tend to increase the covalence of the cation-anion bonds. The increased covalence of the bonding can in turn increase the likelihood of cation displacements through a second order Jahn-Teller-like distortion of the d$^0$ cation and could influence the ferroelectric properties of the oxynitride perovskites by suppressing the formation of a ferroelectric phase and enhancing the paraelectric properties into a superparaelectric state. Even the oxynitride formation could be associated with a structural change from cubic symmetry (Pm3m) to non-cubic (e.g., tetragonal) or quasi-cubic with increased in the tetragonal distortion (c/a ratio). On the other hand, the mixed occupancy of the anion site in oxynitrides AB(O$_{1-x}$N$_x$)$_3$, provides a condition similar to that found in relaxors, as the polarizing octahedral cations (Ti$^{4+}$) will experience random chemical environments in the absence of complete O/N sites ordering. Anion control has previously been utilized to tune the properties of ferromagnetic and paramagnetic perovskite or double perovskite materials.

Most recently both N$_2$ and NH$_3$ containing plasmas have been used for the nitridation of cubic perovskite single crystals, bulk ceramic, and thin film samples, such as SrTiO$_3$, and for PLD and RF-sputtered depositions of BaTaO$_2$N$_1$, as well as growth of LaTiO$_2$N$_1$ epitaxial thin films on SrTiO$_3$ or MgO substrates from oxynitride targets. However, there have been no reports of deposition and characterization of oxynitride polycrystalline ABO$_2$N$_1$ or ABO$_{3-y}$N$_y$ thin films grown on Pt electrodes on common large size commercially available substrates nor any C-V or I-V characteristics of any ferroelectric oxynitride perovskite, except for the dielectric constants of LaTiO$_2$N$_1$ and BaTaO$_2$N$_1$ thin films at zero dc bias. In addition, even epitaxially grown BaTaO$_2$N films at 760° C. from a oxynitride target on a SrTiO$_3$:Nb substrate with a SrRuO$_3$ buffer by PLD method with gas ratio of N$_2$/O$_2$ of 20:1 had a dielectric constant of only 220, which is about 20 less than that of BaTaO$_2$N bulk samples. Temperature coefficient of capacitance (TCC) of BaTaO$_2$N films from 10K to 300K is in the range of −50 ppm/K to 100 ppm/K.

For the case of RF sputter-deposited LaTiO$_2$N$_1$, the dielectric constant had been reported to be from 400 to 1100 without any bulk ceramic data shown for comparison and without any voltage tunability or TCC data.

It had been previously observed that that the presence of N$_2$ in the plasma reduces the surface defects on the electrodes as well as reducing the leakage current with almost no noticeable enhancement of the dielectric constant in SrTiO$_3$ films for low deposition temperatures (200° C.). The observed lower leakage (higher insulation resistance) in N-doped SrTiO$_3$ films had been attributed to nitrogen substitution of the oxygen vacancies generated by the high deposition rate of the SrTiO$_3$, and N compensation of the donor sites created by the oxygen vacancies, without any further evidence or actual mechanism causing the lower leakage.

All of the commonly known deposition methods of BST films, and particular solutions for achieving high voltage tunability and/or high capacitance density required for achieving better performance variable capacitors and/or high density decoupling thin film capacitors, typically require using very high deposition temperatures of about 800° C. or higher, very high post-deposition annealing temperatures between 800° C. and 900° C., and thicker BST dielectric layers, typically between 200 nm and 600 nm, all of which make it very difficult to simultaneously achieve large volume manufacturing reproducible quality paraelectric thin films with reasonably high tunability ratios, i.e., tunability ratios of at least 4-6:1, under applied DC biases below 6-8 Volts, low dielectric loss, i.e., of less than 1% at 1 KHz or 1 GHz, which is typically only possible at lower deposition temperatures of about 600° C. to about 650° C. The deposition of oxynitride perovskite thin films requires using epitaxially matching substrates which are not available in large manufacturing sizes and typically obtained oxynitride perovskite materials are not stable above 600° C. if annealed in oxygen atmospheres.

SUMMARY OF THE INVENTION

To overcome the problems described above, preferred embodiments of the present invention provide a novel oxynitride paraelectric nanocomposite material which exhibits no measurable ferroelectricity and has good voltage tunable properties as well as a high dielectric constant, and also provide a method of producing of oxynitride paraelectric nanocomposite material that is compatible with large volume manufacturing processes.

In accordance with a preferred embodiment of the present invention, a method of depositing oxynitride containing dielectric thin layers with perovskite structure in a radio frequency (RF) physical vapor deposition (PVD) process from insulating or semiconducting ceramic targets is provided.

According to a preferred embodiment of the present invention, an RF sputter deposition process preferably provides a dense crystalline composite paraelectric material that includes nano-regions containing rich $N^{3-}$ anions dispersed in a nano-grain sized matrix of crystalline oxide perovskite material, wherein $(ABO_{3-\delta})_\alpha-(ABO_{3-\delta-\gamma}N_\gamma)_{1-\alpha}$ ($0.01<\gamma<1.5$) or $(Ba_{1-x}Sr_x)TiO_{3-\delta})_\alpha-(Ba_{1-x}Sr_x)TiO_{3-\delta-\gamma}N_\gamma)_{1-\alpha}$ or BSTON-BSTO ($0.5<1-x<0.8$) nanocomposite films, which can be utilized as a dielectric layer, for example, in voltage tunable capacitors, high density capacitance devices, such as de-coupling thin film capacitors, or monolithically integrated with other micro-electronic or passive devices.

A method of depositing a perovskite or ceramic oxide layer according to a preferred embodiment of the present invention preferably includes placing a substrate in a PVD reactor; flowing a gaseous mixture, for example, argon, nitrogen and oxygen, through the reactor; maintaining the sputtering gas mixture under a constant pressure using an automatic pressure control (APC) valve, and applying RF power to a target or applying different RF power levels to multiple targets simultaneously; wherein each target material includes a perovskite-type multicomponent ceramic oxide material, single metal oxides, or single metal nitrides, such as BST, TiN, and $GdTiO_x$ positioned with an approximately 45 degree off-axis configuration relative to the substrate.

According to another preferred embodiment of the present invention, the deposition process preferably occurs with very little oxygen, for example, less than about <1%, present in the gas mixture ($Ar+N_2+O_2$) flow while the $N_2/O_2$ gas flow ratio is relatively high, and preferably between 40 to 58, to provide a high insulation resistance perovskite structure nanocomposite film with nitrogen-rich nano-regions in an oxide matrix as opposed to pure oxide grown perovskite films which predominantly include columnar grains and have much lower insulation resistances and lower dielectric constants. The resulting nanocomposite oxynitride films have much higher breakdown voltages, typically greater than 32 Volts for 10 nm-150 nm thick films, with uniform dielectric constant and voltage tunability, and low temperature coefficients of capacitance and tunability.

According to various preferred embodiments of the present invention, the substrate is preferably preheated. The substrate may preferably be heated to temperatures from about 550° C. to about 700° C. for perovskite nanocomposite oxynitride film deposition on various substrates capable of withstanding such a temperature range with appropriate heating and cooling rates from/to room temperature. A perovskite nanocomposite oxynitride layer having a thickness from about 75 nm to about 1-2 microns thick may preferably be deposited.

In a preferred embodiment of the present invention, the perovskite nanocomposite oxynitride layer formed on the substrate is preferably later rapid thermally annealed (RTA). The annealing atmosphere may preferably be 100% $N_2$ or an $N_2+O_2$ mixture having an oxygen concentration of about 1% to 2% in $N_2$. The annealing temperature may preferably be as low as about 450° C. and as high as about 700° C. depending on the thermal stresses that are induced by the difference in coefficient of thermal expansion between the dielectric perovskite layer and the substrate during the deposition and during the post-deposition anneal to guarantee lower dielectric loss factor (tan δ). The perovskite nanocomposite oxynitride films may preferably be doped with either transition metal dopants, for example, zirconium, niobium, tantalum, scandium; lanthanides including the rare earth ions, such as gadolinium, for example; and/or other amphoteric elements, such as Ge, Sn, for example.

According to a preferred embodiment of the present invention, a parallel-plate thin-film capacitor having a stacked structure is preferably provided. The parallel-plate thin-film capacitor structure preferably includes one or more capacitor structures deposited on a substrate, wherein each capacitor structure includes a bottom electrode layer, a bottom buffer oxide perovskite layer, main oxynitride perovskite nanocomposite layer, for example, a BSTON-BSTO dielectric layer deposited over the bottom electrode layer or over the bottom buffer oxide layer, and a top electrode layer deposited over the nanocomposite BSTON-BSTO dielectric layer or over the top buffer oxide layer. An additional conducting interconnect layer may preferably be deposited over the top electrode layer of the capacitor device structure.

According to various preferred embodiment of the present invention, most of the layers of the capacitor structure may preferably be formed within the same reactor chamber of a PVD reactor.

The oxynitride perovskite nanocomposite layer may preferably be deposited on a substrate coated with platinum or other suitable conductive electrode material that is sufficiently stable at intermediate deposition temperatures of, for example, about 500° C. to about 700° C., and during the annealing that is needed for the processed capacitor structure.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
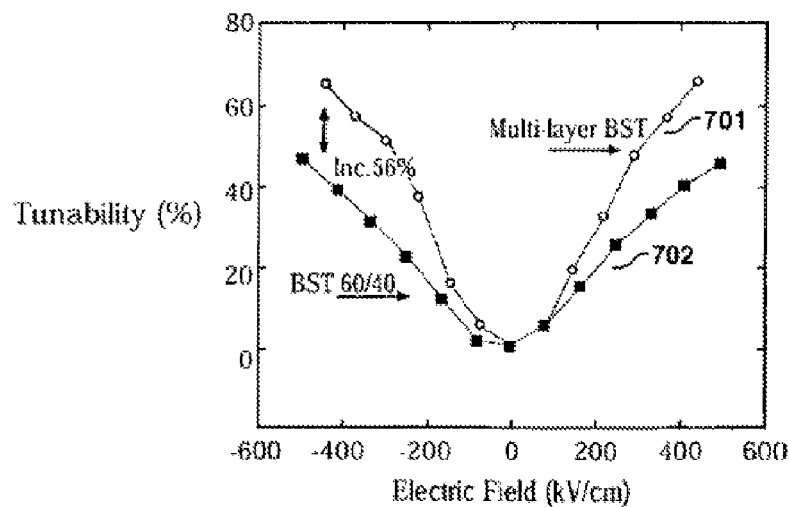
FIG. 1 illustrates the conventional typical voltage tunability achieved with a ferroelectric varactor using a thin-film BST material.
Figure 2:
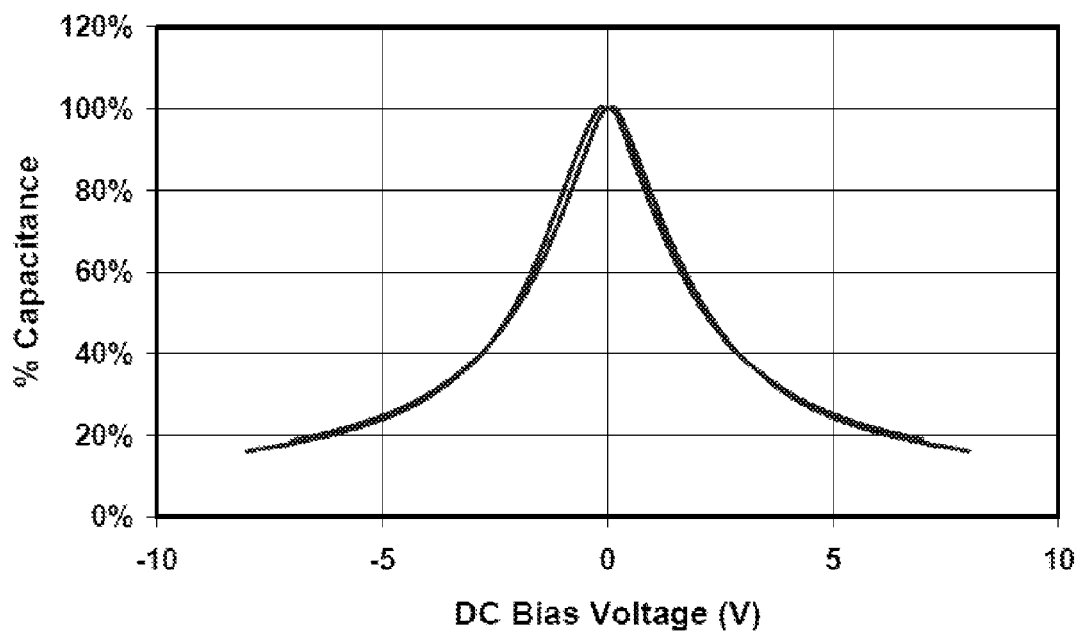
FIG. 2 illustrates the typically achieved voltage tunability of a ferroelectric varactor using a thin-film sputtered BST material on a $Pt/Al_2O_3$ substrate.
Figure 3:
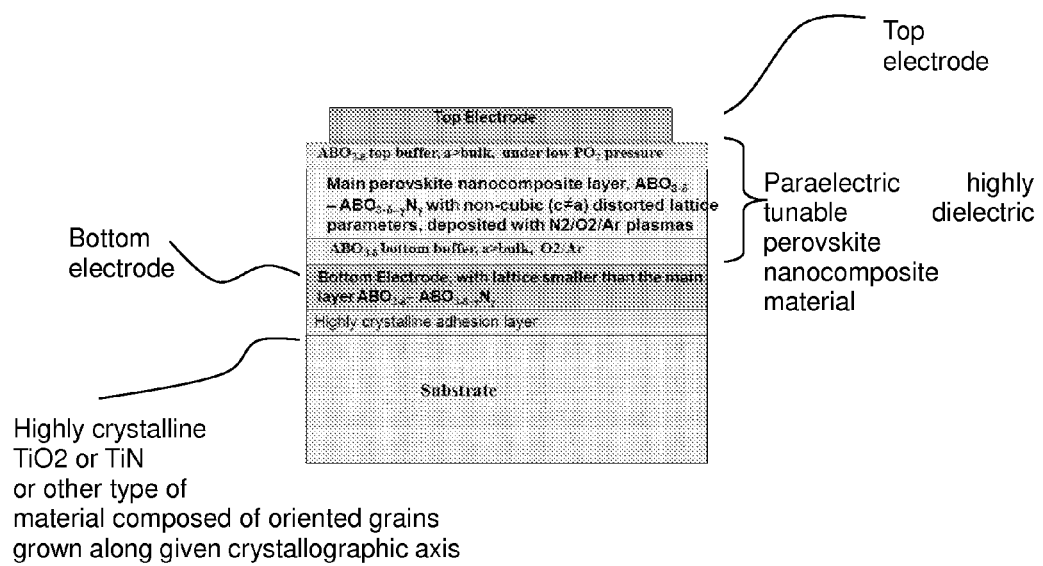
FIG. 3 is a schematic representation of a high tunability nonlinear perovskite multilayer structure with a main layer, a nanocomposite material according to a preferred embodiment of the present invention, wherein the material is integrated within a parallel plate varactor device configuration utilizing one or more bottom electrodes and one or more top electrodes.

A highly tunable ferroelectric variable capacitor (varactor) structure according to a preferred embodiment of the present invention, as shown in FIG. 3, preferably includes a single layer or multiple layers of crystalline composite paraelectric material including nano-regions containing rich $N^{3-}$ anions dispersed in a nano-grain sized matrix of crystalline oxide perovskite material, wherein $(ABO_{3-\delta})_\alpha$-$(ABO_{3-\delta-\gamma}N_\gamma)_{1-\alpha}$ ($0.01<\gamma<1.5$) or $(Ba_{1-x},Sr_x)TiO_{3-\delta})_\alpha$—$(Ba_{1-x},Sr_x)TiO_{3-\delta-\gamma}N_\gamma)_{1-\alpha}$ or BSTON-BSTO ($0.5<1-x<0.8$), or a multilayer combination of such oxide or oxynitride nanocomposite perovskites, deposited between bottom and top electrode layers.

Figure 4:
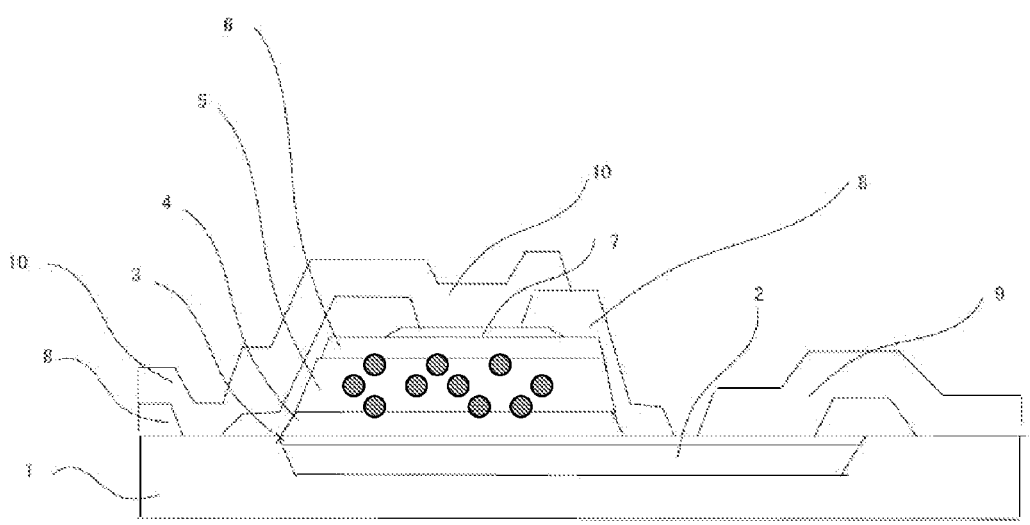
FIG. 4 is a schematic representation of a parallel plate low loss, highly variable material layer, a nanocomposite material according to a preferred embodiment of the present invention, wherein the material is integrated within a parallel plate varactor device configuration.

FIG. 3 and FIG. 4 are schematic cross-sections of the highly tunable ferroelectric variable capacitor including a substrate 1 preferably made of sapphire, LiNbO$_3$, LiTaO$_3$, Al$_2$O$_3$ ceramic, LTCC, Si, (silicon on insulator) SOI, GaAs, SiC, GaN, or other suitable materials, for example. On the substrate 1, a highly crystalline and very thin adhesion layer preferably having a thickness of about 10 nm to about 30 nm, for example, is deposited before the bottom electrode deposition. The adhesion layer may preferably be RF or DC sputtered at low temperatures of about 100° C. to about 300° C., for example, from Ti target with $O_2+Ar$ gas mixture and then loaded in a high vacuum and heated-up to sufficiently high temperatures of 550° C. to about 700° C., for example, similar to the deposition temperature of the bottom electrode layer. The deposition of the TiO$_x$ adhesion layer on the substrate is followed by the deposition of bottom electrode layer preferably having a thickness of about 80 nm to about 400 nm, for example, at high temperatures of about 500° C. to about 700° C., for example, using RF sputtering with $N_2+Ar$ mixtures. Before actual deposition, the TiO$_x$ layer is exposed for about 10 min. to about 20 min. at such temperatures in high vacuum of about $2\times10^{-5}$ Pa, for example, which obtains a highly oriented rutile phase with predominant (101) XRD peak with 2-theta of approximately 36 degrees, for example, that also produces an improved crystalline quality of a Pt(111) film with sufficient surface roughness stability in the sequential deposition of the perovskite thin films.

An optional core bottom electrode 2 is either recessed and planarized to the substrate level or conventionally deposited and patterned by ion milling, for example. The core bottom electrode 2 is preferably made of a highly conductive metal or metallic alloy including Cu, Al, W, Ag, Au, other suitable metallic material, for example, that is capped with a diffusion barrier conductive layer such, as TiN, TaN, ZrN, TaSiN, TiAlN, for example, and finally coated with an additional different type of electrode material 3 (e.g., Pt).

A high dielectric constant, preferably greater than 100, dielectric bottom buffer layer 4 is preferably arranged near the bottom electrode with a given lattice expansion ratio and deposited with controlled oxygen partial pressure of about 1% to about 5% $O_2$ in Ar, for example, to ensure optimal oxygen stoichiometry and sufficient crystallinity. This buffer layer may be deposited using the same material as the main nonlinear dielectric layer 5, such as $(Ba_{1-x},Sr_x)TiO_{3-\delta})_\alpha$—$(Ba_{1-x},Sr_x)TiO_{3-\delta-\gamma}N_\gamma)_{1-\alpha}$ or BSTON-BSTO ($0.5<1-x<0.8$) or a multilayer combination of such nanocomposite oxynitride perovskites or oxide perovskite material $(Ba_{1-x},Sr_x)TiO_{3-\delta}$.

A thin electrode material 3 that is stable at high temperatures, such as Pt, Ru, Ir, Ni, for example, or a conductive oxide or oxynitride material, such as $LaNiO_3$, $SrRuO_3$, $SrIrO3$, $LaTiO_2N_1$, $(La,Sr)TiOxNy$, for example, may be used as an upper portion of the bottom electrode 2.

The main layer 5 with nonlinear dielectric dependence of the dielectric constant and high voltage tunability which is a crystalline composite paraelectric material preferably includes nano-regions containing rich $N^{3-}$ anions dispersed in a nano-grain sized matrix of crystalline oxide perovskite material, wherein $(ABO_{3-\delta})_\alpha\text{-}(ABO_{3-\delta-\gamma}N_\gamma)_{1-\alpha}$ ($0.01<\gamma<1.5$) or $(Ba_{1-x},Sr_x)TiO_{3-\delta})_\alpha$—$(Ba_{1-x},Sr_x)TiO_{3-\delta-\gamma}N_\gamma)_{1-\alpha}$ or BSTON-BSTO ($0.5<1-x<0.8$) and/or a multilayer combination of such perovskites that is partially anion substituted (nitrogen, boron, fluorine, or their combinations) and/or includes nitrogen with deferent valence states (e.g., $N^{3-}$ and $N^{2-}$) and/or $ABO_3$ material with controllable modification of the lattice parameters that can be achieved by the addition of a different gas mixture including nitrogen ($N_2$, $N_2O$, $NH_3$ or other N-containing gas or organic compound containing $NH_2$— groups), Kr, Ne, He or other gases. Preferably, the main nonlinear dielectric layer 5 is RF sputtered or deposited by any other suitable PVD method at intermediate to high temperatures of about 500° C. to about 750° C., for example, with $Ar/O_2/N_2$ gas or other gases, e.g., Kr, He, Ne, $N_2O$, for example, and their mixtures with appropriate $N_2/O_2$ ratios that are preferably between about 22 and about 58, and more preferably between about 40 and about 48, for example, which enables appropriate oxygen and nitrogen partial pressures to be obtained. The RF power densities are typically from about 4.4 $W/cm^2$ to about 5.5 $W/cm^2$ and sputtering pressures from about 0.3 Pa to about 1 Pa, for example.

The high dielectric constant (>100) dielectric top buffer layer 6 near the top electrode is preferably deposited with controlled oxygen partial pressure to ensure some oxygen non-stoichiometry and low surface roughness. This buffer layer may preferably be deposited as the same material as the main nonlinear dielectric layer such as $(Ba_{1-x},Sr_x)TiO_{3-\delta})_\alpha$—$(Ba_{1-x},Sr_x)TiO_{3-\delta-\gamma}N_\gamma)_{1-\alpha}$ or BSTON-BSTO ($0.5<1-x<0.8$) or as a multilayer combination of such nanocomposite oxynitride perovskites or oxide perovskite material $(Ba_{1-x},Sr_x)TiO_{3-\delta}$, and/or a multilayer combination of any suitable oxide or anion-substituted perovskites. The oxygen partial pressure used for the top buffer 6 layer deposition is preferably much lower than the one used for the bottom buffer layer 4 in order to enable formation of symmetrical Schottky barriers between the perovskite and metal electrode interface which also produces symmetrical C-V characteristics even as deposited without any post-annealing, since the deposition temperatures used for the top and bottom electrodes are very different.

A top electrode material 7, such as Pt, Ru, Ir, Ni, for example, and/or a conductive oxide or oxynitride material, such as $LaNiO_3$, $SrRuO_3$, $SrIrO_3$, $LaTiO_2N_1$, $(La,Sr)TiOxNy$, for example, as a lower portion of the upper electrode layer 10 that can also function as a low resistivity metal interconnect layer is preferably provided. The top electrode material 7 is preferably deposited by DC sputtering at about 100° C. to about 200° C., for example, directly on the top buffer perovskite layer. Preferably using photolithography and other patterning techniques, such as ion milling, a mesa-structure is formed and high tunability of the capacitance thin film variable capacitors (varactors) can be formed as shown on FIG. 4. The thickness of the top electrode layer is preferably about 200 nm to about 400 nm, for example.

An Interlayer dielectric (ILD) 8 is preferably provided that functions as an insulation layer between top and bottom electrodes. The ILD 8 can preferably be made of $Al_2O_3$, $SiO_2$, $SiN_x$, or other type of low dielectric constant insulating material, for example, and can preferably be deposited by sputtering, e-beam evaporation, or plasma enhanced CVD (PECVD) or low pressure CVD (LPCVD), for example. The thickness of the Interlayer dielectric (ILD) 8 is preferably about 200 nm to about 600 nm, for example, and it is preferably deposited at low temperatures of about 100° C. to about 300° C.

Low resistivity (low loss) metal interconnect layers 9 and 10 are preferably arranged to connect the bottom and top electrodes to other integrated passive devices or to the I/O pads of the ferroelectric device. The material of the interconnect layers 9 and 10 can preferably be Al, Cu, Au, for example, with sufficient thickness of about 1 um to about 5 um, for example.

More specifically, a perovskite dielectric thin film varactor structure according to a preferred embodiment of the present invention preferably includes a deposition at medium temperature of a crystalline adhesion layer, such as TiN, $TiO_2$, or other suitable adhesion layer, for example, deposition at medium temperatures of about 200° C. to about 450° C. and vacuum annealing or directly annealing at high temperatures of about 600° C. to about 800° C., for example, thus enabling the bottom electrode layer of conductive material to have a high crystalline quality with crystals oriented predominantly along (111) crystallographic plane of a highly conductive metal, such as Pt, Ni, Cu, Ag, Al, or other multilayers separated by appropriate barrier layer(s), for example, a perovskite buffer (seed) $ABO_3$ layer with a controlled value of its lattice constant, typically greater than the bulk value. In the case of the BST bottom buffer, the lattice constant will preferably be about 3.997 Å to about 4.00 Å, for example, which is greater than the bulk value of a $Ba_{0.7}Sr_{0.3}TiO_3$ target, that has a cubic lattice constant a of about 3.974 Å, deposited at intermediate (about 300° C. to about 400° C.) to high temperatures (about 500° C. to about 800° C.) by PVD method (RF sputtering) using an $Ar/O_2$ atmosphere with a given range of oxygen partial pressures preferably of about $PO_2>10^{-6}$ atm, for example, deposited on top of the bottom electrode layer. A main crystalline composite paraelectric material includes nano-regions containing rich $N^{3-}$ anions dispersed in a nano-grain sized matrix of crystalline oxide perovskite material, wherein a $(ABO_{3-\delta})_\alpha\text{-}(ABO_{3-\delta-\gamma}N_\gamma)_{1-\alpha}$ ($0.01<\gamma<1.5$) or $(Ba_{1-x},Sr_x)TiO_{3-\delta})_\alpha$—$(Ba_{1-x},Sr_x)TiO_{3-\delta-\gamma}N_\gamma)_{1-\alpha}$ or a BSTON-BSTO ($0.5<1-x<0.8$) nanocomposite film is deposited at high temperatures of about 550° C. to about 700° C., for example, on top of the buffer (seed) layer preferably in a different gas mixture including nitrogen ($N_2$), or $N_2O$, $NH_3$ or other N-containing gas or organic compound containing $NH_2$— groups, for example, with an effectively non-cubically distorted lattice constant (c/a ratio) that is much greater than that of the buffer (seed) layer. Preferably, the quasicubic-lattice or the c-lattice (noncubic crystal) is increased by about 3% to about 5-7%, e.g., about 4.065 Å for BSTON-BSTO(1-x(Ba)=0.7, as compared to the bottom buffer layer. Therefore, the tetragonality ratio c/a of the BSTON-BSTO nanocomposite layer can preferably be as high as about 1.03 deposited under the typical $N_2/O_2$ ratios, followed by an additional top buffer layer deposited with very low or close to zero oxygen partial pressures, e.g., $PO_2 < 10^{-6}$ atm, and a top electrode layer of conductive electrode material 7 on top of the dielectric layer deposited at low temperatures of about 100° C. to about 300° C., for example. The lattice constant of about 4.065 Å for the BSTON-BSTO main dielectric layer (1-x(Ba)= 0.7) is significantly expanded as compared to the oxide perovskite buffer layer which remains closer to the bulk BST ceramic(1-x(Ba)=0.7) cubic crystal of about 3.974 Å. Preferably, the lattice constant of the buffer layer is in the range of about 3.990 Å to about 4.00 Å, and c/a=1.005, for example. In another preferred embodiment of the present invention, the lattice constant of about 3.995 Å for the BSTON-BSTO main dielectric layer (1-x(Ba)=0.5) is significantly expanded as compared to the oxide perovskite buffer layer which remains closer to the bulk BST ceramic (1-x(Ba)=0.5) cubic crystal of about 3.9537 Å. Typically, the lattice constant of the buffer layer is in the range of about 3.973 Å to about 3.982 Å, for example.

Figure 5:
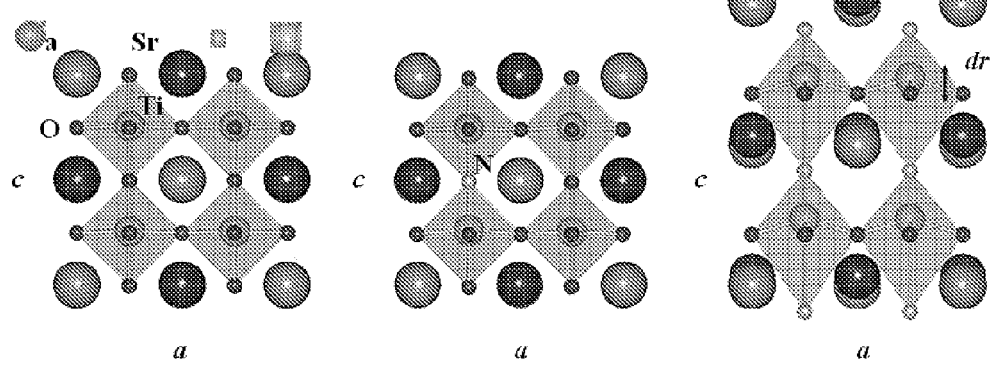
FIG. 5 shows the density functional theory (DFT) generalized gradient approximation (GGA) predicted structural properties of oxynitride perovskite $(Ba,Sr)TiO_{3-\delta}N_\delta$ with an example for $(Ba_{0.5}Sr_{0.5})TiO_{3-\gamma}N_\gamma$ with various concentrations of N anion substitution.
Figure 6:
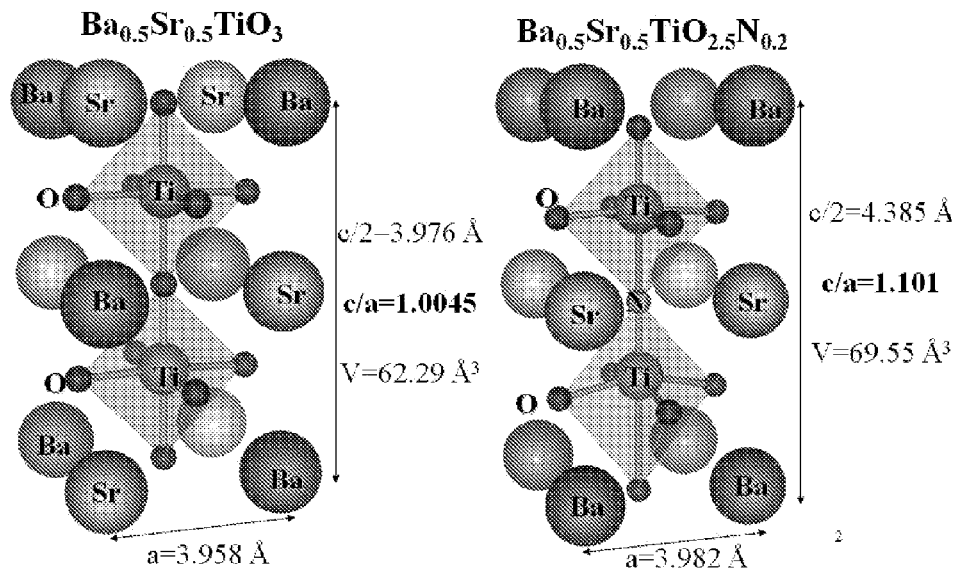
FIG. 6 shows lattice constants a and c, lattice volumes, quasicubic lattice constants $a_c$, and tetragonality ratios (c/a). Similar structural effects induced by the partial substitution with various amount of nitrogen anions are also predicted and expected for other oxynitride perovskites in a Gd (Ti,Zr) $O_{3-\gamma}N_\gamma$ system.
Figure 7:
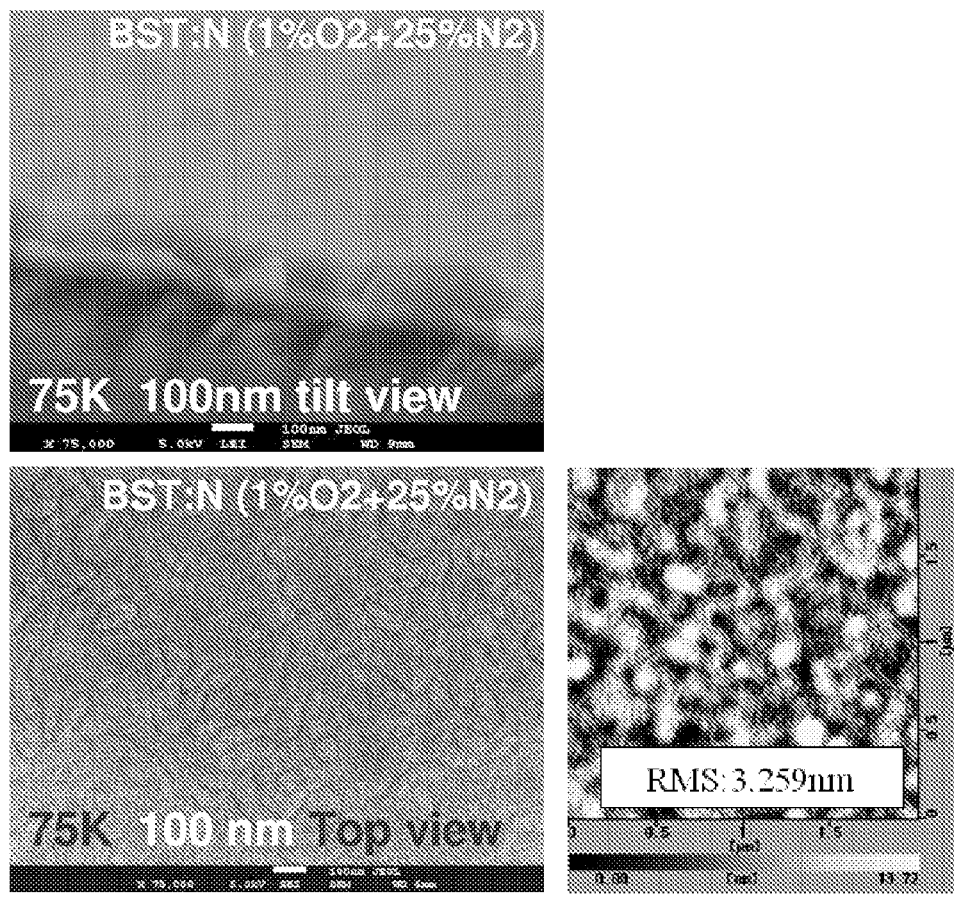
FIG. 7 is a reproduction of a cross-sectional tilt view (top left) and plan view (bottom left) of field emission scanning electron microscope (FE-SEM) micrographs, with white color bar of 100 nm, showing the surface morphology of 700° C. deposited $(Ba,Sr)TiO_{3-\delta-\gamma}N_\gamma$—$(Ba,Sr)TiO_{3-\delta}$ thin film material (sputtered with gas mixture containing 1% $O_2$, 25% $N_2$ and remaining balance of Ar) deposited on Pt/TiOx/sapphire according to a preferred embodiment of the present invention. AFM observation (bottom right) of the surface roughness (RMS) from the same $(Ba,Sr)TiO_{3-\delta-\gamma}N_\gamma$—$(Ba,Sr)TiO_{3-\delta}$ thin film sample is also shown.
Figure 8:
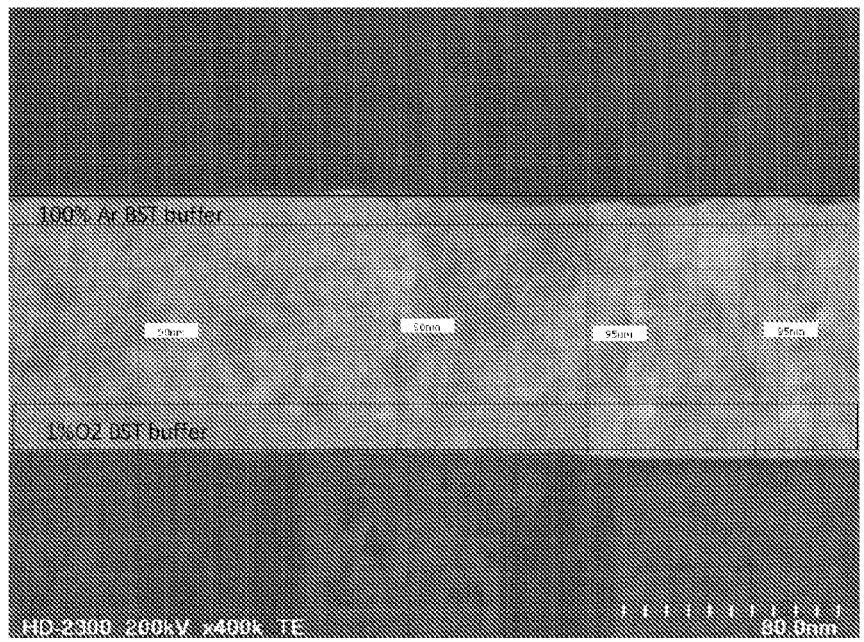
FIG. 8 is a typical low resolution TEM (Transmission Electron Microscopy) image of a typical $Pt/(Ba_{0.7}Sr_{0.3})TiO_{3-\delta-\gamma}N_\gamma$—$(Ba_{0.7}Sr_{0.3})TiO_{3-\delta}/Pt(111)/TiOx/$sapphire sample with top and bottom BST buffer layers.
Figure 9:
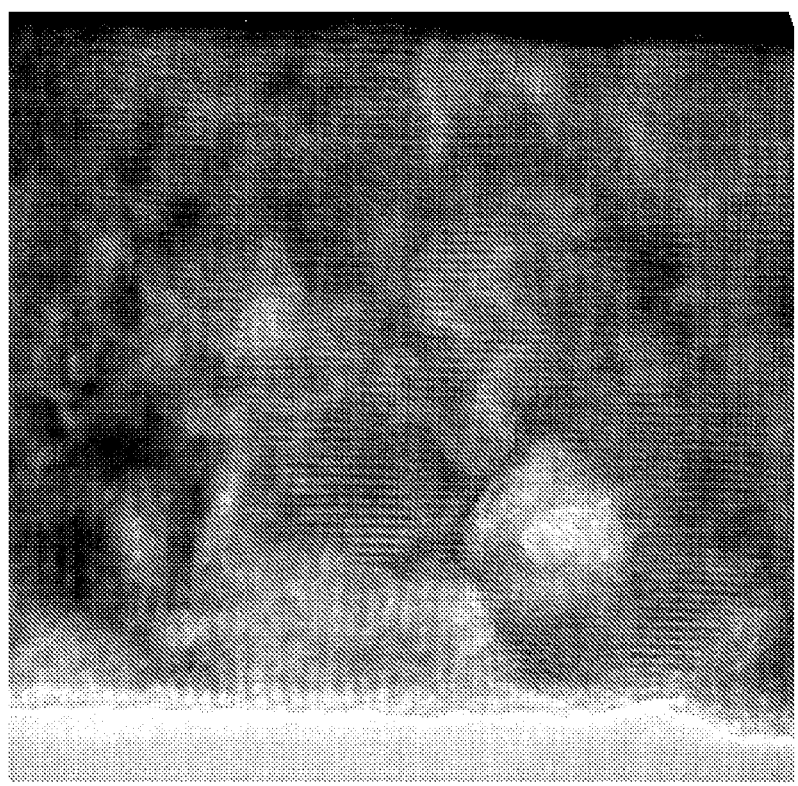
FIG. 9 is a high-resolution TEM image of a $(Ba_{0.7}Sr_{0.3})TiO_{3-\delta-\gamma}N_\gamma(Ba_{0.7}Sr_{0.3})TiO_{3-\delta}/Pt(111)/TiOx/$sapphire sample.
Figure 10:
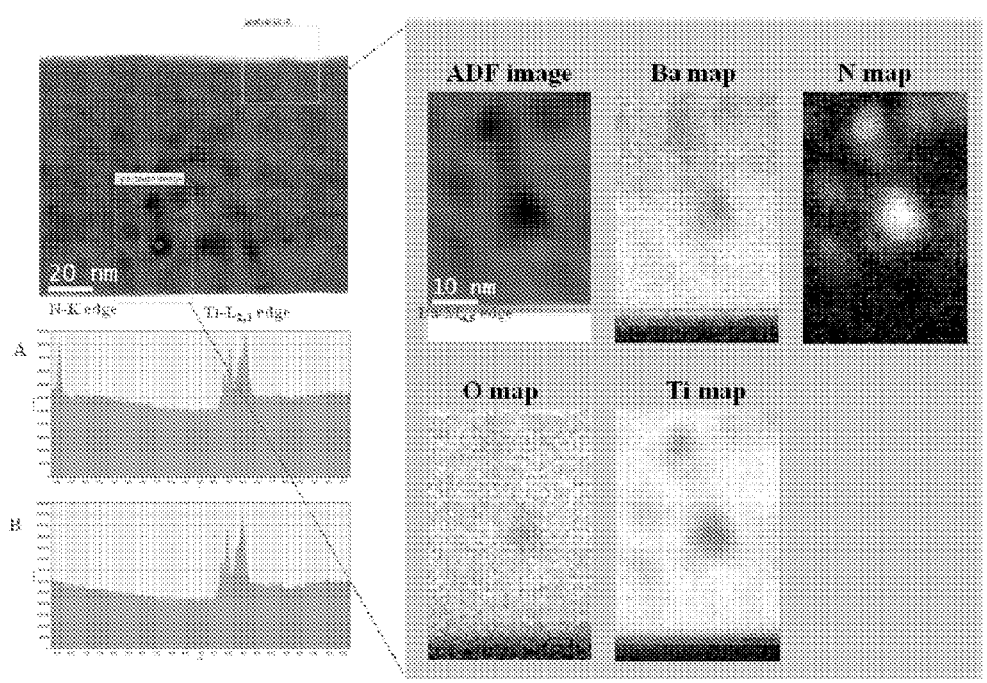
FIG. 10 is a typical high resolution STEM-EELS (Scanning Transmission Electron Microscopy—Electron energy loss spectroscopy) cross-sectional mapping of a $Pt/(Ba_{0.7}Sr_{0.3})TiO_{3-\delta-\gamma}N_\gamma$—$(Ba_{0.7}Sr_{0.3})TiO_{3-\delta}//Pt(111)/TiOx/$sapphire sample showing the distribution maps (concentrations) of the perovskite film major constituents, such as Ba, Ti, O and N. An ADF (Annular dark field) cross-sectional pattern with "dark" spots $(Ba_{0.7}Sr_{0.3})TiO_{3-\delta-\gamma}N_\gamma$ correlates well with EELS maps for the regions with higher N concentration within $(Ba_{0.7}Sr_{0.3})TiO_{3-\delta}$ matrix.

The inventors the present invention observed that an increase in the lattice parameter or lattice volume with an $N_2/O_2$ gas flow ratio may be a result of the lattice strain due to defects in the film, bottom layer(s) misfit strain, film stress (ion bombardment or gas incorporation in to the film), and/or a change in the lattice induced by a change of the Ti—N bond length during the partial substation of O—Ti—O with O—Ti—N incorporated into the BSTON-BSTO nancomposite crystalline layer. In this regard, by using density functional theory (DFT) generalized gradient approximation (GGA), it had been estimated that the ideal tetragonal lattice volumes from which to extract the quasi-cubic lattices for $Ba_{0.5}Sr_{0.5}TiO_3$, $Ba_{0.5}Sr_{0.5}TiO_{2.5}N_{0.2}$ and $BaSrTiO_2N_1$, as summarized in FIG. 5 and FIG. 6, which show that with an increase of the N amount into the $Ba_{0.5}Sr_{0.5}TiO_3$, the quasi-cubic lattice parameter $a_c$ will increase monotonically with the increase of the N/O ratio of the $ABO_xN_y$ lattice from about 3.964 to about 4.070 for nitrogen concentrations from about 0 to about 0.081, which also correlates with an increase of the tetragonality ratio c/a from about 1.0045 to about 1.058, as shown in FIG. 6. Experimentally observed c/a for the BSTON-BSTO main dielectric layer (1-x(Ba)=0.7) is not significantly different (about 1.025 to about 1.03) for the average nitrogen concentration (estimated from XPS N 1s peak) of about 0.024.

The observed enlargement of the unit-cell volume for the BSTO films sputtered with approximately 25%-50% $N_2$ in the plasma while maintaining the oxygen partial pressure almost constant between about 0.5% and about 0.8% showed some tendency which is very consistent in comparison to the theoretical modeling, and that alone cannot be associated with the commonly observed phenomena for conventionally sputtered BSTO films while the oxygen partial pressure is reduced by orders to be able produce such lattice expansion phenomenon. Some type of chemical interaction of N occurs within the BSTO lattice, and it is actually incorporated into the BSTO lattice or localized areas, since under the same $N_2/O_2$ ratio of about 40 to about 58 at deposition temperatures of less than about 600° C., the BSTO lattice is still somehow expanded, but the tetragonality ratio is not significantly deviated from the bulk level of about 1.006. The lower tetragonality ratio also correlates with non-enhancement of the dielectric constant of the BSTO which is the case for BSTO that is deposited at about 550° C. For temperatures greater than about 600° C., higher $N_2/O_2$ ratios lead not only to lattice volume enlargement, but also to a significant increase of the tetragonality ratio up to about 1.025.

Usually thicker (about 300 nm to about 800 nm) sputtered conventional BSTO films tend to have larger tetragonality, e.g., about 1.012, for example, but that is not the case for thinner (about 100 nm to about 150 nm) conventionally sputtered BSTO films. Therefore, the observed large tetragonality of BSTON-BSTO nancomposite films as high as about 1.030 on Pt/TiOx/sapphire substrates most definitely originates from the chemical incorporation of N into some of the Ti—O bonds of the BSTO lattice.

Figure 11:
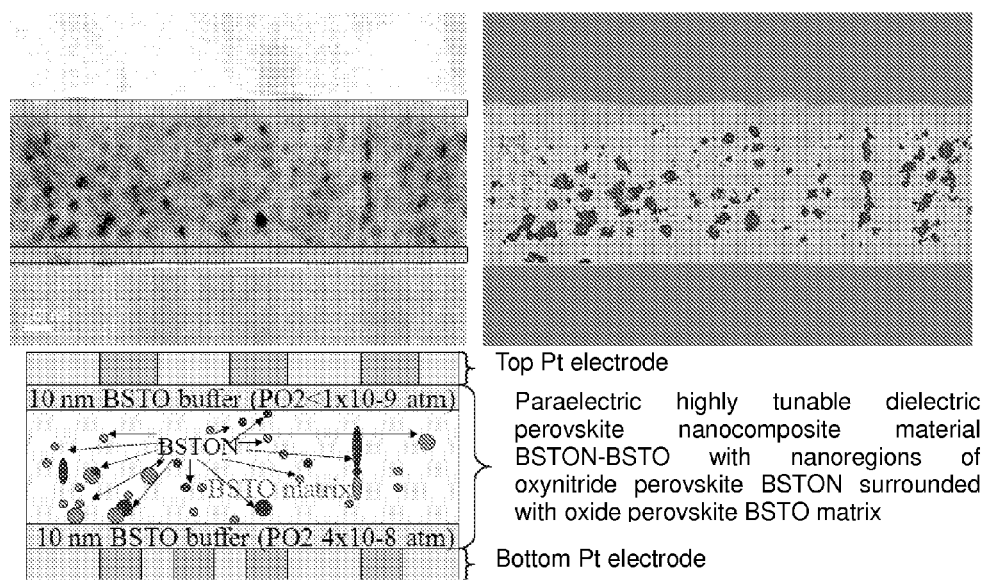
FIG. 11 is the typical low resolution dark-field transmission electron microscopy cross-sectional image and reconstructed regions with a representative model sketch of the areas with chemically bonded rich-N clusters within the oxide perovskite matrix.
Figure 12:
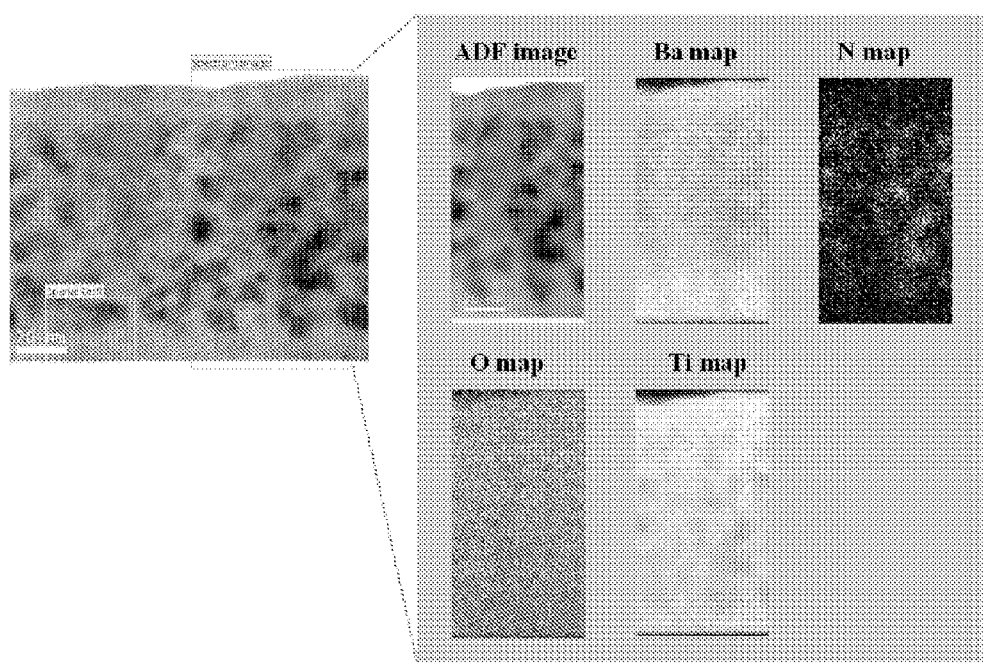
FIG. 12 is an additional high resolution STEM-EELS (Scanning Transmission Electron Microscopy—Electron energy loss spectroscopy) cross-sectional mapping of a $Pt/(Ba_{0.7}Sr_{0.3})TiO_{3-\delta-\gamma}N_\gamma$—$(Ba_{0.7}Sr_{0.3})TiO_{3-\delta}//Pt(111)/TiOx/$sapphire sample showing the distribution maps (concentrations) of the perovskite film major constituents, such as Ba, Ti, O and N. An ADF (Annular dark field) cross-sectional pattern correlates well with EELS maps for the regions with higher N concentration within $(Ba_{0.7}Sr_{0.3})TiO_{3-\delta-\gamma}N_\gamma$.
Figure 13:
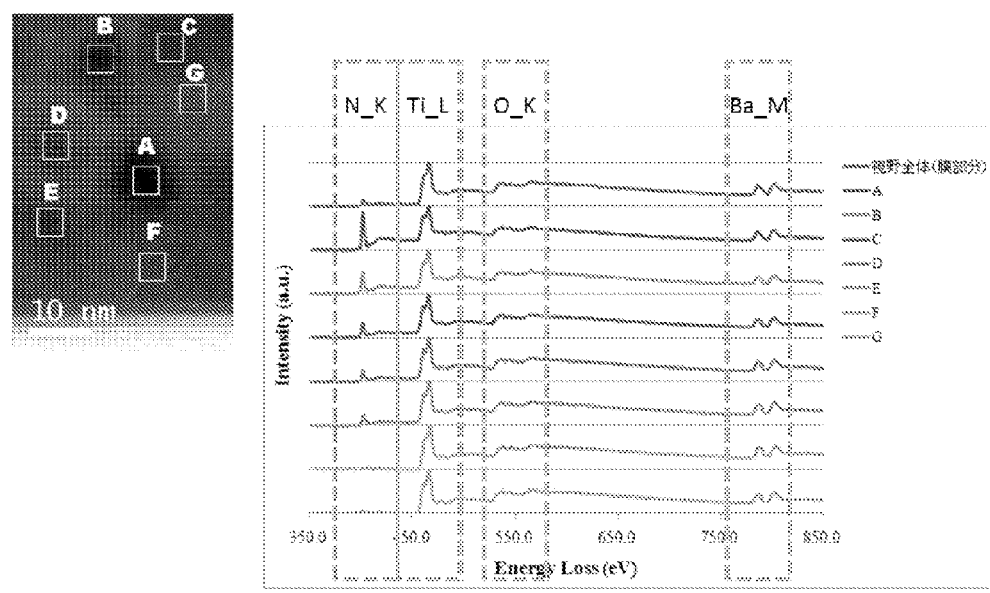
FIG. 13 is an additional high resolution STEM-EELS (Scanning Transmission Electron Microscopy—Electron energy loss spectroscopy) cross-sectional mapping of a $Pt/(Ba_{0.7}Sr_{0.3})TiO_{3-\delta-\gamma}N_\gamma$—$(Ba_{0.7}Sr_{0.3})TiO_{3-\delta}/Pt(111)/TiOx/$sapphire sample showing the distribution maps (concentrations) of the nitrogen (K-line), Ti (L-line), Oxygen (K-line) and Ba(M-line) across the different nano-regions (labeled as A, B, C, D, E, F, G) of the perovskite composite film. Significant variation of the nitrogen peak intensity (concentration) can be clearly observed.

As shown by STEM (Scanning Transmission Electron Microscopy) cross-sectional analysis with "dark" spots of $(Ba_{0.7}Sr_{0.3})TiO_{3-\delta-\gamma}N_7$ correlates well with EELS (Electron energy loss spectroscopy) maps for the nano-regions with higher N concentration within $(Ba_{0.7}Sr_{0.3})TiO_{3-\delta}$.matrix. FIGS. 11-13 show typical STEM-EELS (Scanning Transmission Electron Microscopy—Electron energy loss spectroscopy) cross-sectional mappings of $Pt/(Ba_{0.7}Sr_{0.3})TiO_{3-\delta-\gamma}N_\gamma$—$(Ba_{0.7}Sr_{0.3})TiO_{3-\delta}$/Pt(111)/TiOx/sapphire samples showing the distribution maps (concentrations) of the nitrogen (K-line), Ti (L-line), Oxygen (K-line) and Ba(M-line) across the different nano-regions (labeled as A, B, C, D, E, F, G) of the perovskite composite film. Significant variations of the nitrogen peak intensity in the EELS N K line can be clearly observed and that correlates well with the ADF maps (darker areas that are with higher N concentration).

Figures 14A, 14B:
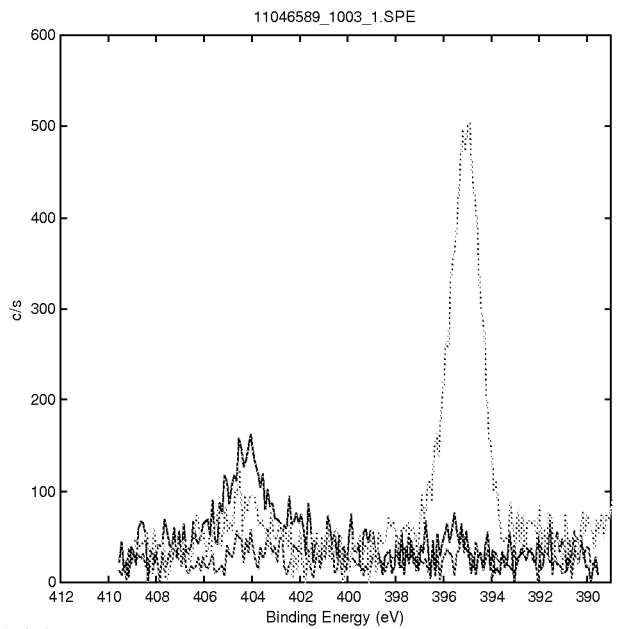
FIG. 14A is an X-ray photoelectron spectroscopy (XPS) high resolution spectra of N1s core levels, which was used to estimate the concentration (from about 1.8% to about 2.4%) of the chemically bonded nitrogen 6 nm below the surface of the $(Ba_{0.7}Sr_{0.3})TiO_{3-\delta-\gamma}N_\gamma$—$(Ba_{0.7}Sr_{0.3})TiO_{3-\delta}$ films after short Ar ion milling. The $N_2/O_2$ gas ratio during sputtering was about 45, while the average nitrogen concentration within the nanocomposite film was $\gamma=0.024$ and $3-\delta$ was 2.976.
FIG. 14B is a table summarizing the observed binding energies, Ti and N concentrations from $(Ba_{0.7}Sr_{0.3})TiO_{3-\delta}N_\delta$—$(Ba_{0.7}Sr_{0.3})TiO_{3-\delta}$ films after short Ar ion milling.

The observed presence of bonded N—Ti—N in BSTON-BSTO nancomposite crystalline layer by the EELS is also supported by the observed strong N 1s XPS peak, as shown in FIG. 14A, which also corresponds to the Ti—N line with a binding energy of about 395.0 eV as observed in many TiO2-xNx nanoparticles and films. That XPS N1 1s peak is very different from the physically adsorbed N 1s peak which has a very different bonding energy of about 404.3 eV (see FIG. 14B).

Figure 15:
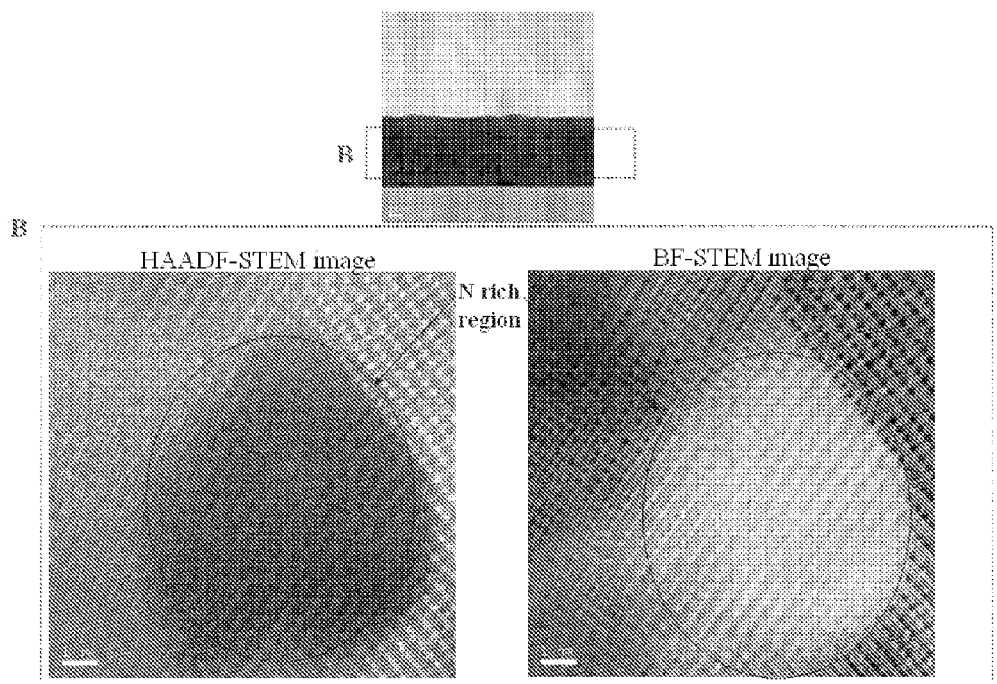
FIG. 15 is a high resolution STEM (Scanning Transmission Electron Microscopy) cross-section image of the same sample shown in FIG. 11. HAADF-STEM (high-angle annular dark-field scanning transmission electron microscopy) and Bright Field (BF-STEM)) images are shown taken from the same "dark" spot in the regions with higher N concentration within $(Ba_{0.7}Sr_{0.3})TiO_{3-\delta}$ matrix as shown with lower magnification in FIG. 11.
Figure 16:
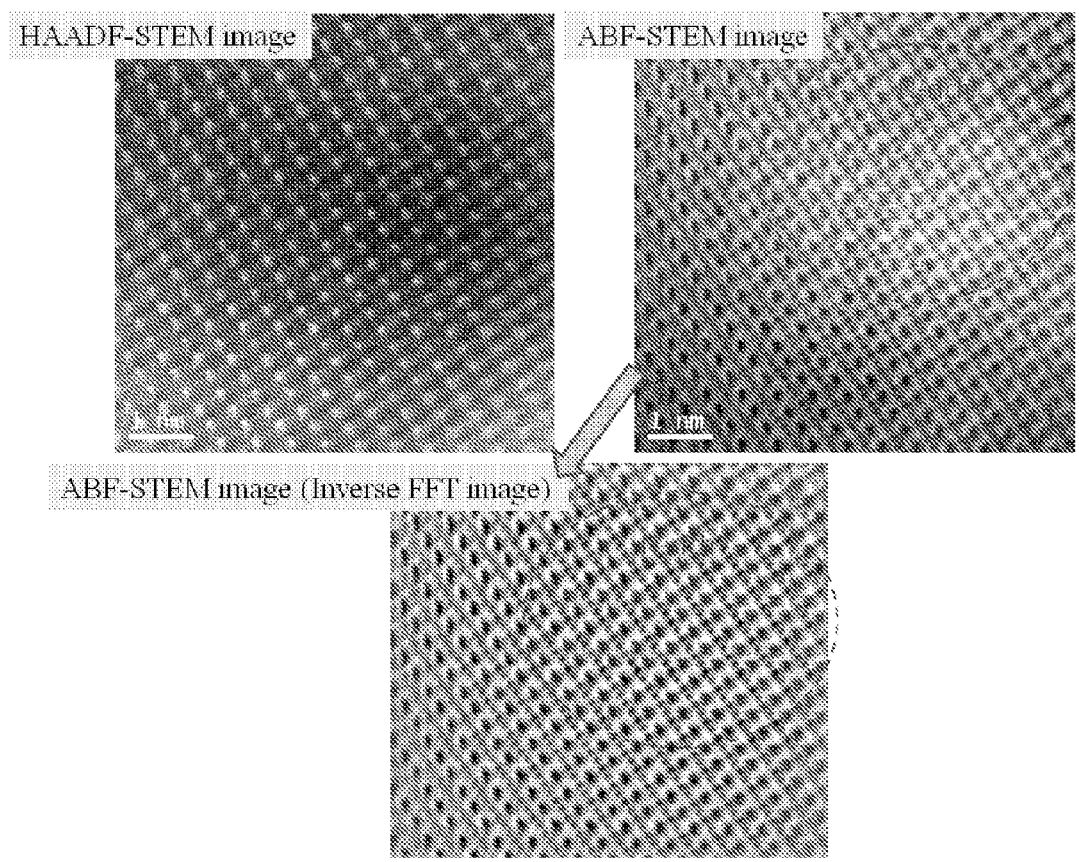
FIG. 16 is a high resolution HAADF-STEM (high-angle annular dark-field scanning transmission electron microscopy) and ABF-STEM: Annular bright field (ABF) scanning transmission electron microscopy (STEM). The third image is the Inverse FFT (Inverse Fast Fourier Transform) image of the ABF-STEM image of $(Ba_{0.7}Sr_{0.3})TiO_{3-\delta}N_\delta$ and $(Ba0.7Sr0.3)TiO_{3-\delta}$ regions.
Figure 17:
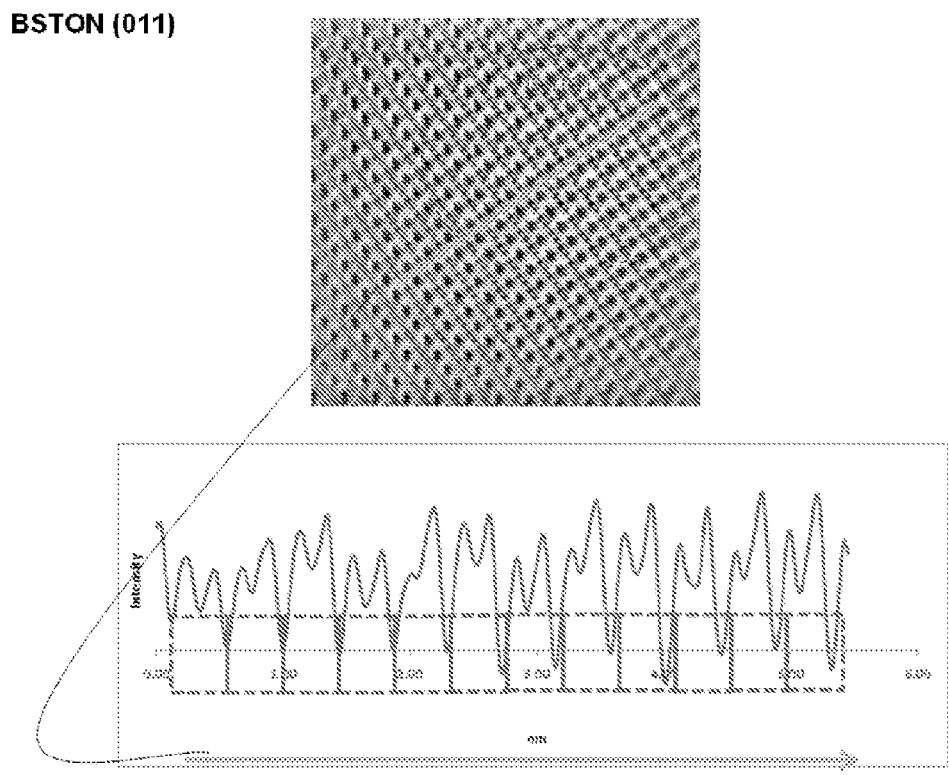
FIG. 17 illustrates the positions and displacement positions of Ti and O(N) atoms as shown in 1D real space along a single line analyzed and plotted as intensity obtained from the inverse Fourier transformed image of the ABF-STEM image shown in FIG. 16. It can be clearly seen that on the right side (N-rich "dark" region") the Ti—N positions (bond lengths) are elongated as compared to the left site which is expected to be originating primarily from the typically shorter Ti—O bond lengths.
Figure 18:
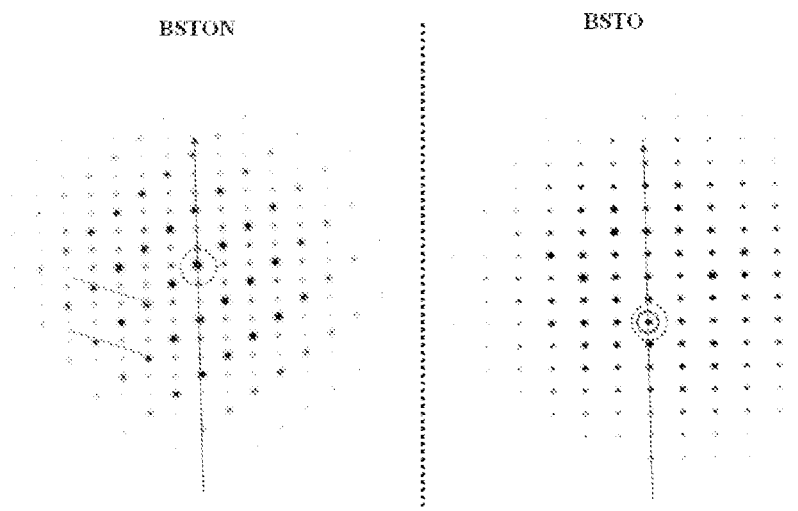
FIG. 18 illustrates selected area Electron Diffraction patterns taken during the TEM cross-section observation of a $(Ba_{0.7}Sr_{0.3})TiO_{3-\delta}N_\delta$—$(Ba_{0.7}Sr_{0.3})TiO_{3-\delta}$ sample (BSTON on the left) and a $(Ba_{0.7}Sr_{0.3})TiO_{3-\delta}$ sample (BSTO on the right).
Figure 19:
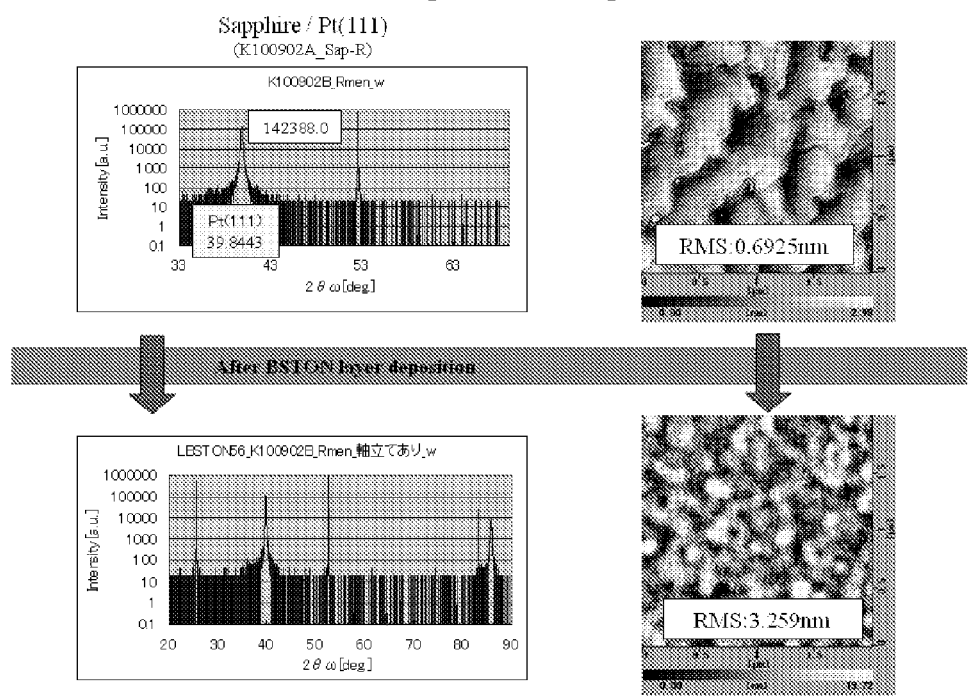
FIG. 19 illustrates XRD and AFM analyses of a Pt bottom electrode deposited at high temperatures of about 600° C. to about 700° C. on a TiOx/sapphire substrate and the $(Ba_{0.7}Sr_{0.3})TiO_{3-\delta-\gamma}N_\gamma$—$(Ba_{0.7}Sr_{0.3})TiO_{3-\delta}$ film deposited on top of the Pt electrode. The surface roughnesses (RMS) of the Pt and the BSTON film are about 0.7 nm and about 3.26 nm, respectively.
Figure 20:
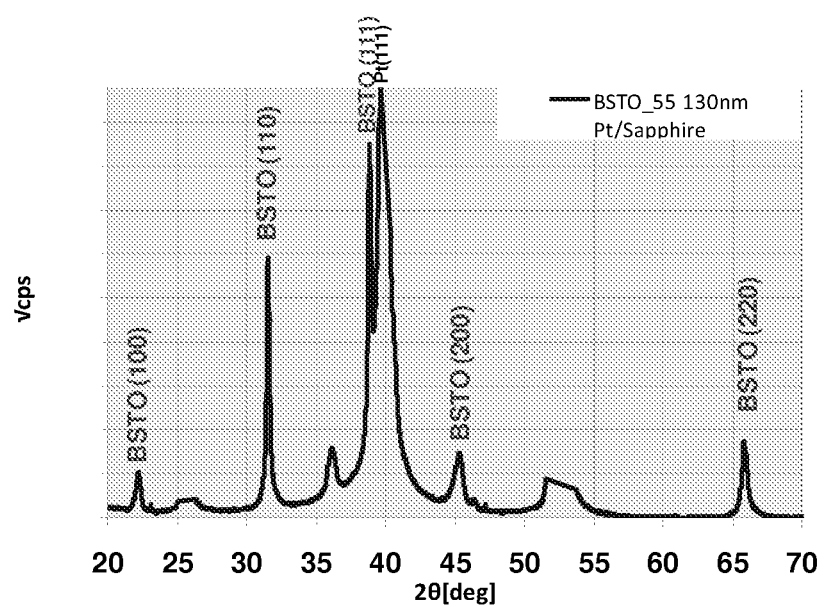
FIG. 20 illustrates XRD spectra taken from a BSTO sample deposited on a Pt/Sapphire substrate.

As shown in FIGS. 15-17, the positions for the oxide cubic perovskite region and for the displacement positions of Ti and O(N) atoms of the oxynitride perovskite nano-region have different contrasts for the very high resolution STEM images. The BSTO and BSTON lattice differences can be clearly observed from their different displacement positions as shown in 1D real space along a single line analyzed and plotted as intensity obtained from the inverse Fourier transformed image of the ABF-STEM image taken from FIG. 16. It can be clearly seen that on the right side (N-rich "dark" region") have Ti—O(N) positions (bond lengths) which are elongated as compared to the left side Ti—O positions which are expected to originate primarily from the typically shorter Ti—O bond lengths.

Figure 22:
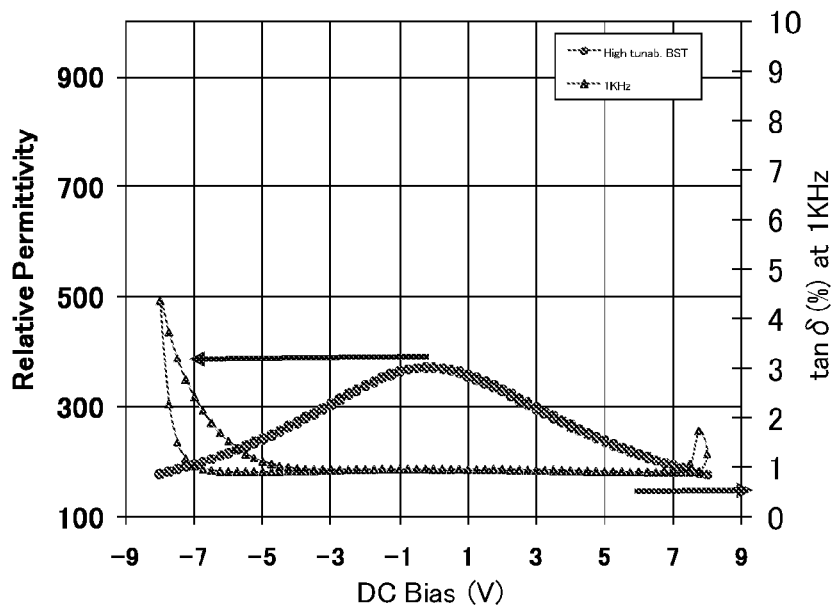
FIG. 22 is a graph showing room temperature voltage tunability and dielectric loss at about 1 KHz as a function of applied DC bias voltages for Pt/BST buffer/BSTO(1% $O_2$+Ar)/BST buffer/Pt/TiO$_x$/Sapphire sample after about 640° C. for about 15 min in 100% $O_2$. It can be clearly seen that greater than −5 Volts DC bias dielectric loss become greater than about 4% at about 1 KHz.
Figure 23:
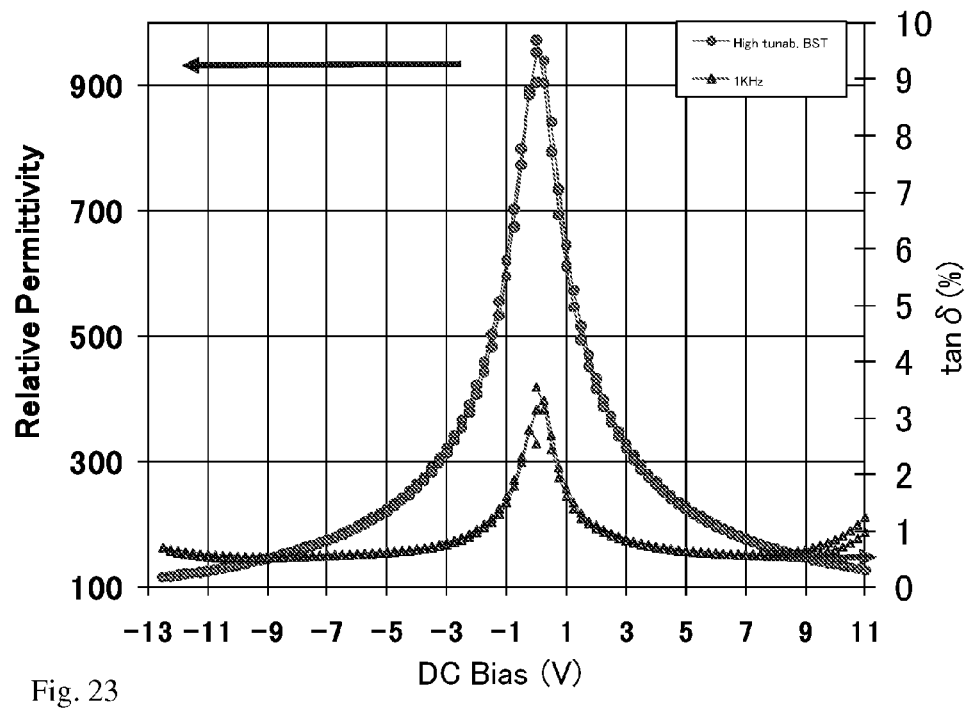
FIG. 23 is a graph showing room temperature voltage tunability and tan δ-V (%) vs. applied DC bias curves for Pt/BST buffer/$(Ba_{0.7}Sr_{0.3})TiO_{3-\delta-\gamma}N_\gamma$—$(Ba_{0.7}Sr_{0.3})TiO_{3-\delta}$ ($N_2/O_2=48$+Ar)/BST buffer/Pt/TiO$_x$/Sapphire, measured from approximately 500 μm diameter size top electrodes structures. $(Ba_{0.7}Sr_{0.3})TiO_{3-\delta-\gamma}N_\gamma$—$(Ba_{0.1}Sr_{0.3})TiO_{3-\delta}$ ($N_2/O_2=48$) sample is annealed at about 600° C. for about 5 min in 1.5% $O_2+N_2$t. Symmetry and stability of the tan δ at very high biases can be clearly observed, which are just two of the advantages achieved by at least one preferred embodiment of the present invention.
Figure 24:
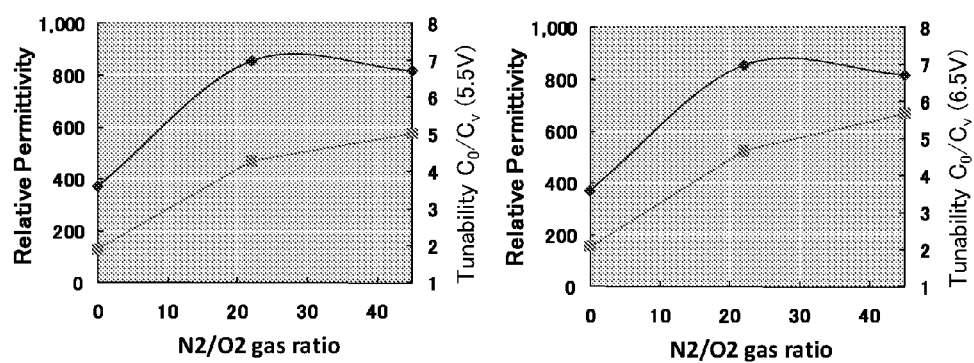
FIG. 24 includes graphs of room temperature relative dielectric constant and voltage tunability at about 5.5 Volts and about 6.5 Volts DC bias curves for Pt/BST buffer/BSTON/BST buffer/Pt/TiO$_x$/Sapphire samples having thicknesses of about 100 nm to about 150 nm with different $N_2/O_2$ gas ratios during deposition by RF sputtering, measured from approximately 500 μm diameter size top electrode structures.
Figure 25:
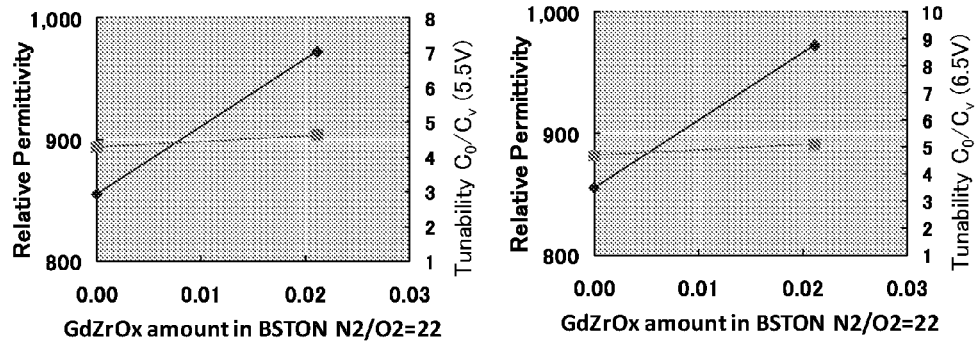
FIG. 25 includes graphs of room temperature relative dielectric constant and voltage tunability curves for Pt/BST buffer/$(Ba_{0.7}Sr_{0.3})TiO_{3-\delta-\gamma}N_\gamma$—$(Ba_{0.7}Sr_{0.3})TiO_{3-\delta}$/BST buffer/Pt/TiO$_x$/Sapphire samples having thicknesses of about 100 nm to about 150 nm with different GdZrO$_x$ amounts deposited with a fixed $N_2/O_2$ gas ratio of about 22 deposited by RF sputtering, measured from approximately 500 μm diameter size top electrode structures.
Figure 26:
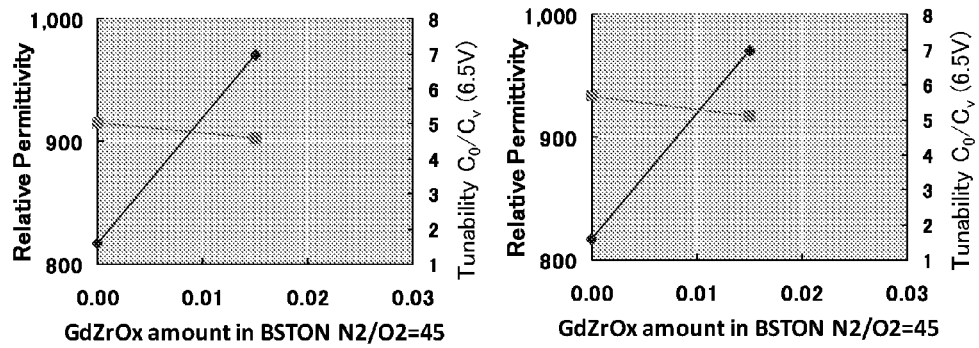
FIG. 26 includes graphs of room temperature relative dielectric constant and voltage tunability curves for Pt/BST buffer/$(Ba_{0.7}Sr_{0.3})TiO_{3-\delta-\gamma}N_\gamma$—$(Ba_{0.7}Sr_{0.3})TiO_{3-\delta}$/BST buffer/Pt/TiO$_x$/Sapphire samples having thicknesses of about 100 nm to about 150 nm with different GdZrOx amounts deposited with a fixed $N_2/O_2$ gas ratio of about 45 deposited by RF sputtering, measured from approximately 500 μm diameter size top electrode structures.
Figure 27:
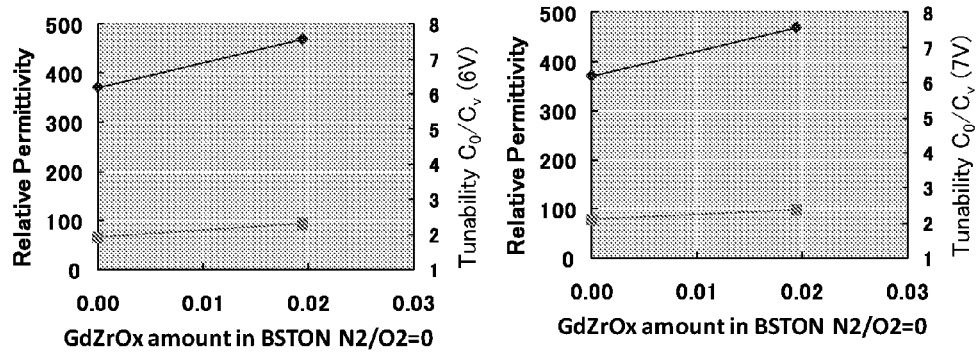
FIG. 27 includes graphs of room temperature relative dielectric constant and voltage tunability curves for Pt/BST buffer/$(Ba_{0.7}Sr_{0.3})TiO_{3-\delta-\gamma}N_\gamma$—$(Ba_{0.7}Sr_{0.3})TiO_{3-\delta}$/BST buffer/Pt/TiO$_x$/Sapphire samples having thicknesses of about 100 nm to about 150 nm with different GdZrOx amounts deposited with a fixed $N_2/O_2$ gas ratio of zero (no N-doping) deposited by RF sputtering, measured from approximately 500 μm diameter size top electrode structures.
Figure 28:
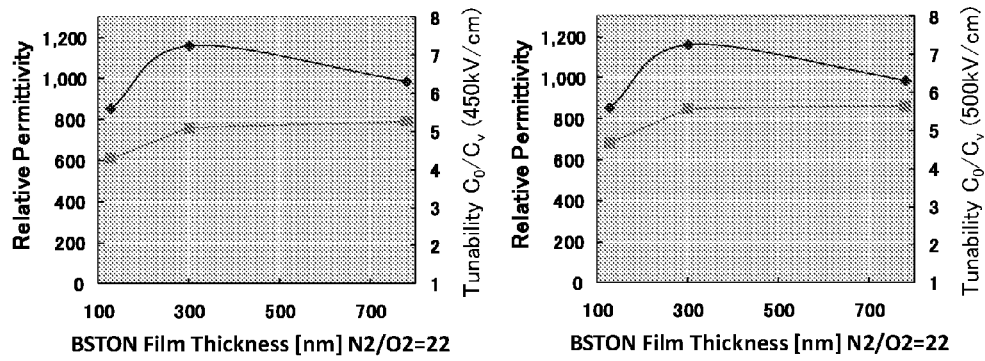
FIG. 28 includes graphs of room temperature voltage tunability under approximately 450 kV/cm and approximately 500 kV/cm electric field biases curves for Pt/BST buffer/$(Ba_{0.7}Sr_{0.3})TiO_{3-\delta-\gamma}N_\gamma$—$(Ba_{0.7}Sr_{0.3})TiO_{3-\delta}$/BST buffer/Pt/TiO$_x$/Sapphire samples having different film thicknesses with a fixed $N_2/O_2$ gas ratio of about 22 during deposition by RF sputtering, measured from approximately 500 μm diameter size top electrodes structures. Very fast saturation of the voltage tunability of close to about 6:1 can be observed for BSTON samples having an approximately 300 nm thickness.

Immediately after deposition of the top electrode layer and the formation of a shadow mask dot structure or after ion milling of the top electrode, the C-V characteristics of the BSTON-BSTO nancomposite films can be directly evaluated. This is because the top Pt electrode deposition at about 100° C. to about 300° C. does not seem to cause any observable damage near the top BST interface. There are a few factors contributing to this. First, the sputtered perovskite films are much denser than films that are deposited using chemical solution decomposition (CSD). Second, the effective use of very low $O_2$ partial pressures to form the top BST buffer layer, the low surface roughness of the top layer of the BST film, and the use of moderate temperatures for the top Pt electrode deposition, all lead to a significantly reduced degree of damage to the BST interface with the top Pt electrode interface area. The sputtered BSTO buffer is arranged to cover the main BSTON-BSTO nancomposite layer. As-deposited BSTON-BSTO films enabled direct evaluation of insulation resistance, dielectric loss, and C-V asymmetry, while for conventionally sputtered BST samples, their C-V remained very unstable under high positive DC biases as shown in FIG. 22 even when the same top buffer layer had been applied for the BSTO films and for all BSTON films. BSTON-BSTO nancomposite films remained very stable under higher DC bias voltages, e.g., from about −12.5V to about +11V as shown in FIG. 23, and with extremely low leakage. Pt/BSTON-BSTO/Pt MIM capacitor structures also are very symmetrical and have low frequency dispersion of C-V curves from about 1 KHz to about 500 KHz. The dielectric loss factor is somehow greater for N-doped BSTON-BSTO films as compared to the BST samples with the same partial pressure control samples of about 0.5%-0.75% $O_2$: typically in the range of about 0.025 at about 1 KHz as compared to about 0.01 for the undoped BST films (both as-deposited without any post-anneals).

Figure 21:
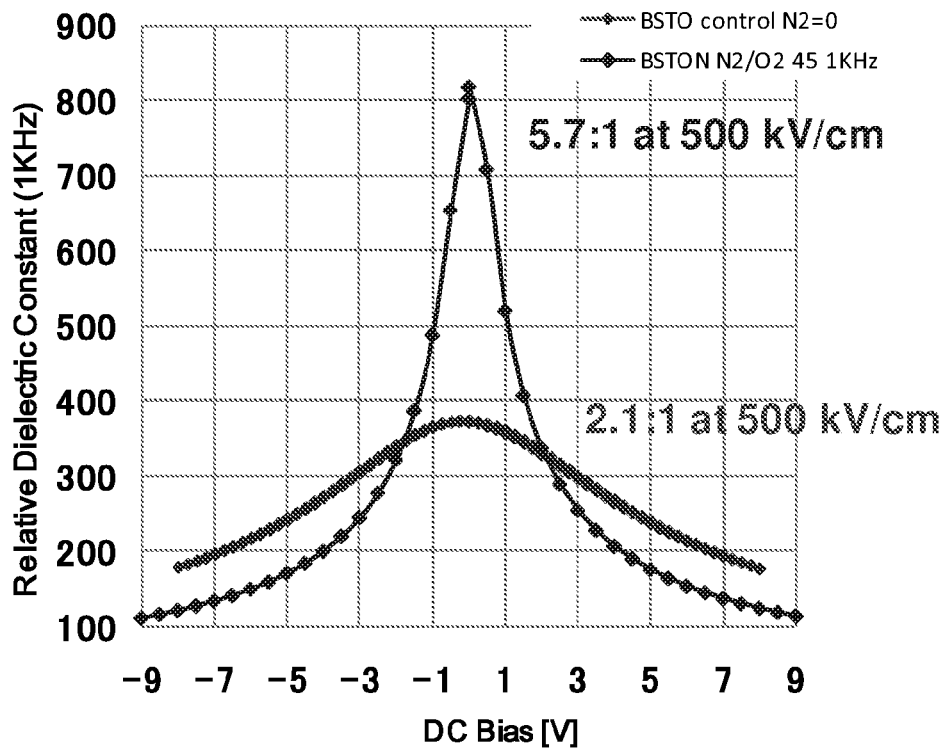
FIG. 21 is a graph showing room temperature voltage tunability results at about 1 KHz as a function of applied DC bias voltages for Pt/BST buffer/BSTO(1% $O_2$+Ar)/BST buffer/Pt/TiO$_x$/Sapphire vs. Pt/BST buffer/$(Ba_{0.7}Sr_{0.3})$ $TiO_{3-\delta-\gamma}N_\gamma(Ba_{0.7}Sr_{0.3})TiO_{3-\delta}$ ($N_2/O_2=45$+Ar)/BST buffer/Pt/TiO$_x$/Sapphire, measured from approximately 500 μm diameter size top electrodes structures. A 1% $O_2$ BSTO film control sample had been annealed at about 640° C. for about 15 min in 100% $O_2$, while the $(Ba_{0.7}Sr_{0.3})TiO_{3-\delta-\gamma}N_\delta$—$(Ba_{0.7}Sr_{0.3})TiO_{3-\delta}$ ($N_2/O_2=45$) sample is annealed at about 600° C. to about 650° C. for about 5 min in 1.5% $O_2+N_2$. Enhancement of voltage tunability from about 2.1:1 to about 5.7:1 at the same electric field of about 500 kV/cm can be clearly demonstrated in preferred embodiments of the present invention.

The observed dielectric constants in the range of about 800 to about 1100 from BSTON-BSTO nancomposite films according to a preferred embodiment of the present invention as compared to about 400 to about 500 for the conventional BSTO films show a similar trend of enhancement of their voltage tunabilities from about 2.1:1 to about 5.7-6.0:1 times under the same electric fields of about 500 kV/cm as shown in FIG. 21.

Particular attention should be paid about the synergy of co-interactions of multiple dopants applied together with the anion doping. For this particular preferred embodiment of the present invention, when the inventors of the present invention perform co-sputtering from $Ba_{0.7}Sr_{0.3}TiO_3$ and $Gd_2Zr_2O_7$ targets simultaneously with different RF power ratios to enable formation of BSTON-BSTO-GZO solid solution nancomposite films under $Ar+O_2+N_2$ atmospheres which induce even further additional tetragonal distortion of the BSTO lattice as compared to pure BSTON-BSTO films, the BSTON-BSTO-GZO films have higher insulation resistance than the BSTON films and also have higher voltage tunabilities of greater than about 6.5:1 at about 6.5 Volts as shown in FIGS. 24-29. The explanation for such additional enhancement of the voltage tunability is likely associated with the fact that a $GdZrO_2N_1$ oxynitride perovskite compound, as theoretically predicted, has one of the largest tetragonality ratios on the order of about 1.35 among other $ABO_2N_1$ class compounds as compared to about 2.33 for the BSTON.

Figure 29:
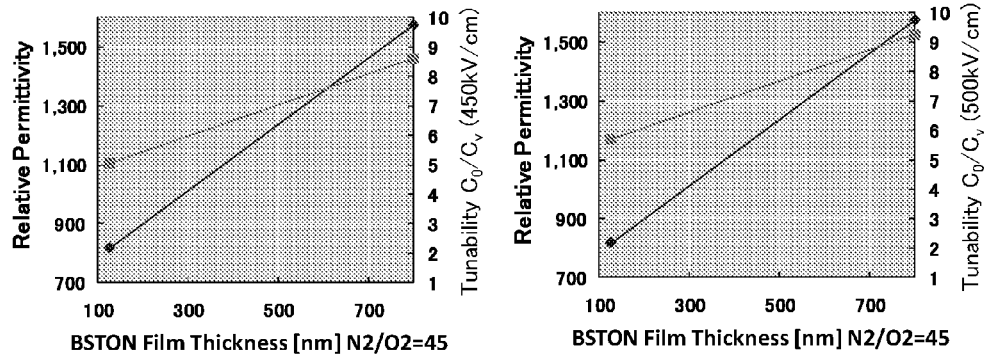
FIG. 29 includes graphs of room temperature voltage tunability under approximately 450 kV/cm and approximately 500 kV/cm electric field biases curves for Pt/BST buffer/$(Ba_{0.7}Sr_{0.3})TiO_{3-\delta-\gamma}N_\gamma$—$(Ba_{0.7}Sr_{0.3})TiO_{3-\delta}$/BST buffer/Pt/TiO$_x$/Sapphire samples having different film thicknesses with a fixed $N_2/O_2$ gas ratio of about 45 during deposition by RF sputtering, measured from approximately 500 μm diameter size top electrodes structures. Continuous increase of the voltage tunability can be observed for BSTON samples having about 100 nm to about 800 nm thicknesses.

(Gd, Zr, N) triple doped BSTO films according to a preferred embodiment of the present invention are shown to have enhanced tetragonality ratios and lattice volumes as compared to BSTO or BSTON-BSTO films. An additional important finding is that, for the first time, there is suppression of a direct correlation dependence between the tunability and dielectric constant for (Gd, Zr) co-doped BSTON film when the $N_2/O_2$ ratio is greater than about 40 as shown in FIG. 29.

Figure 30:
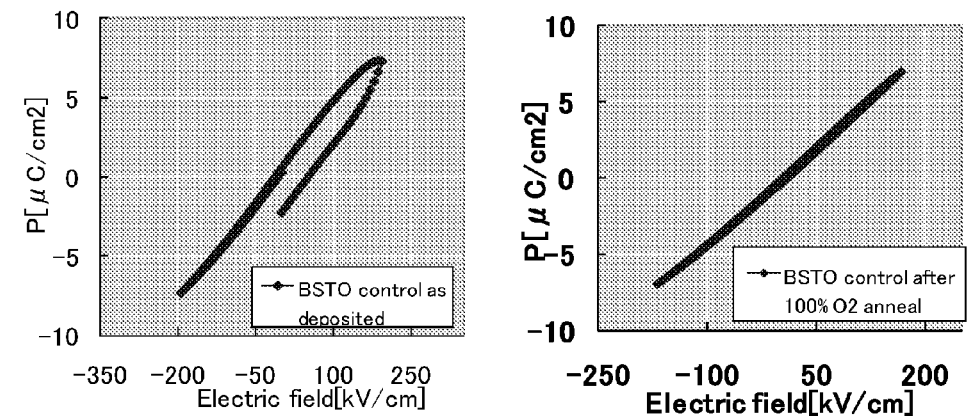
FIG. 30 includes graphs showing polarization hysteresis loops vs. applied Electric field (P-E) curves for an as-deposited Pt/BST buffer/BSTO(1% $O_2+Ar$)/BST buffer/Pt/TiO$_x$/Sapphire sample and for the same sample after about 640° C. for about 15 min in 100% $O_2$.
Figure 31:
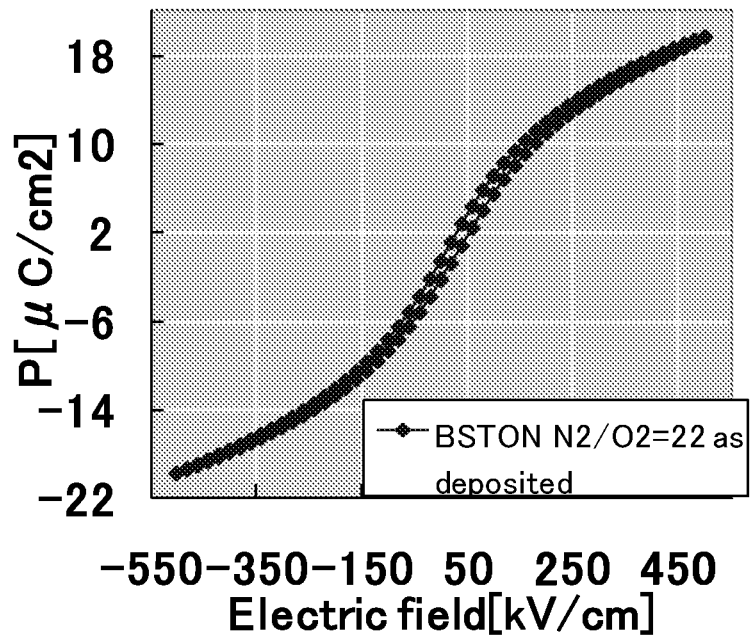
FIG. 31 is a graph showing polarization hysteresis loop vs. applied Electric field (P-E) curves for an as-deposited approximately 150 nm Pt/BST buffer/$(Ba_{0.7}Sr_{0.3})TiO_{3-\delta-\gamma}N_\gamma$—$(Ba_{0.7}Sr_{0.3})TiO_{3-\delta}$($N_2/O_2=22+Ar$)/BST buffer/Pt/TiO$_x$/Sapphire sample, measured from approximately 500 μm diameter size top electrode structures.
Figure 32:
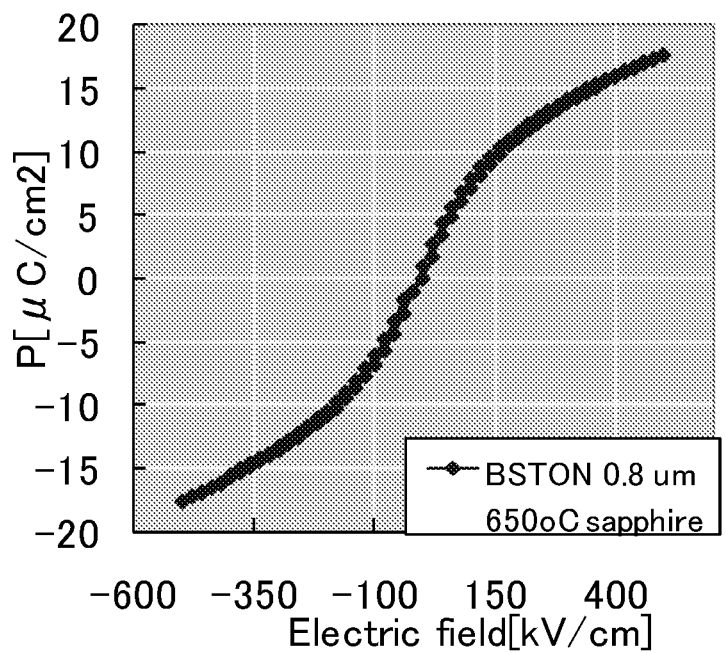
FIG. 32 is a graph showing polarization hysteresis loop vs. applied Electric field (P-E) curves for an as-deposited approximately 800 nm Pt/BST buffer/$(Ba_{0.7}Sr_{0.3})TiO_{3-\delta-\gamma}N_\gamma$—$(Ba_{0.7}Sr_{0.3})TiO_{3-\delta}$($N_2/O_2=22+Ar$)/BST buffer/Pt/TiO$_x$/Sapphire sample, measured from approximately 500 μm diameter size top electrode structures.

Another important performance of the shadow mask BSTON-BSTO highly tunable thin film capacitors according to a preferred embodiment of the present invention is their polarization hysteresis loop vs. applied Electric field (P-E) characteristics. In FIGS. 30-32, the P-E curves of Pt/BSTO/Pt/TiO$_x$/Sapphire and Pt/BSTON-BSTO/Pt/TiO$_x$/Sapphire capacitor samples are shown. Typical behavior originating from the superparaelectric state of the BSTON-BSTO films at room temperature is similar to that of $SrTiO_3$ bulk and thin film samples measured below about 100K.

Figure 33:
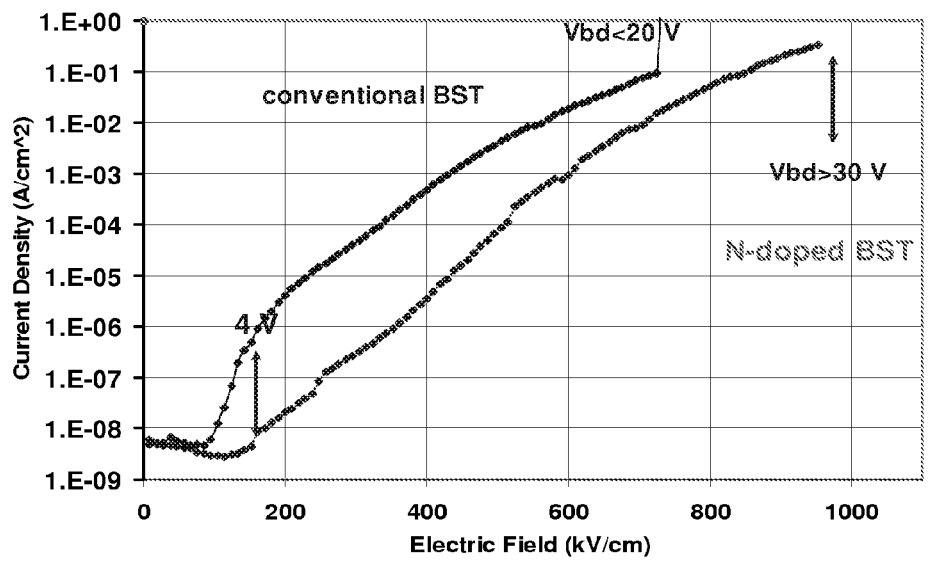
FIG. 33 is a graph showing leakage current density vs. applied Electric field (J-E) curves up to the breakdown fields for Pt/BST(1% $O_2+Ar$)/Pt/TiO$_x$/Sapphire and Pt/BST buffer/$(Ba_{0.7}Sr_{0.3})TiO_{3-\delta-\gamma}N_\gamma$—$(Ba_{0.7}Sr_{0.3})TiO_{3-\delta}$($N_2/O_2=22+Ar$)/BST buffer/Pt/TiO$_x$/Sapphire capacitor samples, measured for approximately 500 μm size diameter circular electrode capacitors without a protective layer or passivation. The BST:N sample had a higher breakdown voltage (not shown) >32 Volts for the same approximately 150 nm thick dielectric thicknesses.

As shown on FIG. 33, BSTON-BSTO nanocomposite films according to various preferred embodiments of the present invention have very high breakdown voltages in the range of about 32 Volts. Such high breakdown voltages were observed for the first time for BSTON-BSTO films samples having high dielectric constant of greater than about 1000 with the thickness from about 90 nm to about 150 nm. Based on the commonly reported data, sputtered undoped $Ba_{0.7}Sr_{0.3}TiO_3$ samples with dielectric constant of about 700 to about 8000 and similar thicknesses only have breakdown voltages of about 20 to about 22 Volts. The leakage current of BSTON-BSTO films capacitors is also very low at about 200 kV/cm electric field or less.

Figure 34:
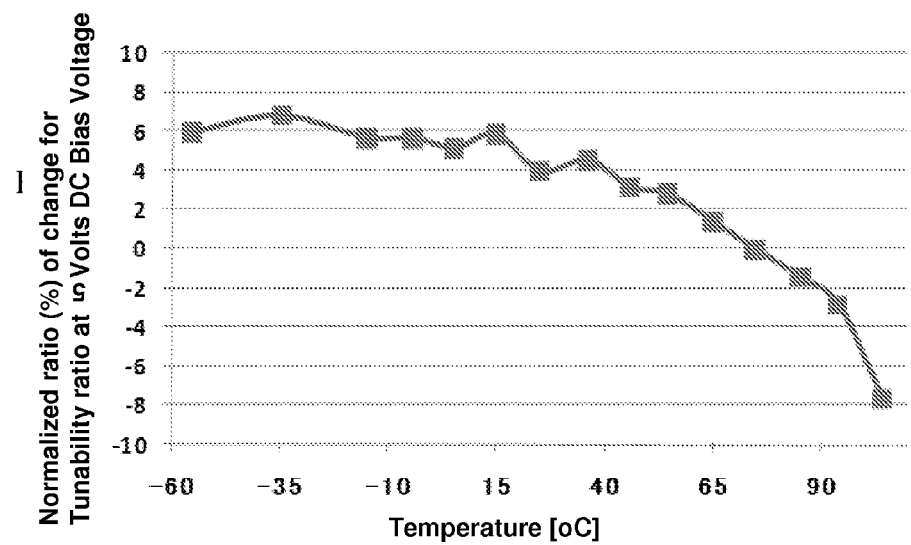
FIG. 34 is a graph showing normalized 5V DC bias tunability vs. temperature curves for the Pt/BSTbuffer/$(Ba_{0.7}Sr_{0.3})TiO_{3-\delta-\gamma}N_\gamma$—$(Ba_{0.7}Sr_{0.3})TiO_{3-\delta}$($N_2/O_2=22+Ar$)/BST buffer/Pt/TiO$_x$/Sapphire sample. The BST(1% $O_2+22\%$ $N_2$) sample is annealed for about 5 min in a $N_2$ atmosphere at about 600° C. As can be seen, the voltage tunability has very little temperature dependence from about −55° C. to about 105° C.

The normalized 5V DC bias tunability vs. temperature curves for the BSTON-BST) film capacitor is shown in FIG. 34. As shown in FIG. 34, the voltage tunability has very little temperature dependence from about −55° C. to about 105° C. in the range of only about +6% to about −8%.

Some benefits and advantages of the perovskite structure nonlinear dielectric thin film capacitor (varactor) having a high voltage tunability at lower DC bias voltages and the method of manufacturing the same according to preferred embodiments of the present invention include the capability to combine multiple technologies, such as physical vapor deposition, co-sputtering to form multiple cathodes ensuring a high deposition rate and a high throughput suitable for high volume manufacturing; deposition of perovskite films with very low oxygen pressures which enables the use of low cost and high conductivity electrode materials; controlling the lattice parameters of materials with the perovskite structure which enables tuning of their voltage dependences of their dielectric constant at low electric fields; maintaining low dielectric loss, low leakage currents at operation voltages, and high breakdown strengths of the N-doped or oxynitride perovskites; maintaining low temperature dependence of zero bias dielectric constant as well as low temperature dependence of voltage tunabilities; and concurrent monolithic integration with high precision capacitor, resistor, and inductor networks capable of providing low loss high performance at high frequencies in tunable circuits, such as tunable band-pass filters, antenna matching, phase shifters, and other suitable circuits, for example.

A method of fabricating a perovskite dielectric thin film capacitor (varactor) according to a preferred embodiment of the present invention preferably includes two generalized steps: (1) forming a highly tunable device structure with appropriate electrodes on top of a substrate; and (2) integrating the highly tunable device structure with other thin film devices, such as, for example, SAW duplexers, RF-MEMS based switches, piezoelectrically actuated MEMS air gap varactors, fixed (low tunability) high density thin film capacitors, TFBAR circuits, resistors, inductors, and oxide based TFT and/or sensors, for example. Other thin film devices, such as well known passive components, for example, can also be used and the above specific examples are non-limiting.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A crystalline perovskite crystalline composite paraelectric material comprising:
   nano-regions containing rich $N^{3-}$ anions dispersed in a nano-grain sized matrix of crystalline oxide perovskite material, wherein $(ABO_{3-\delta})_\alpha$-$(ABO_{3-\delta-\gamma}N_\gamma)_{1-\alpha}$; wherein
   A represents a divalent element, B represents a tetravalent element; and
   $\gamma$ satisfies $0.005 \le \gamma \le 1.0$;
   $1-\alpha$ satisfies $0.05 \le 1-\alpha \le 0.9$; and
   $1-\alpha$ is an area ratio between the nano-regions containing rich $N^{3-}$ anions and the matrix of remaining oxide perovskite material.

2. The crystalline perovskite crystalline composite paraelectric material according to claim 1, wherein $\gamma$ satisfy $0.005 \le \gamma \le 0.1$ and $1-\alpha$ satisfies $0.05 \le 1-\alpha \le 0.2$.

3. The crystalline perovskite crystalline composite paraelectric material according to claim 1, wherein
   A is at least one material selected from the group consisting of Ba, Sr, Gd and Ca; and
   B is at least one material selected from the group consisting of Ti, Zr, Hf, Sc and Ge.

4. The crystalline perovskite crystalline composite paraelectric material according to claim 1, wherein
   the compound is represented by $\{(Ba_pSr_{1-p})TiO_{3-\delta}\}_\alpha$—$\{(Ba_pSr_{1-p})TiO_{3-\delta2-\gamma}N_\gamma\}_{1-\alpha}$; and
   p satisfies $0.40 \le p \le 0.69$.

5. The crystalline perovskite crystalline composite paraelectric material according to claim 1, wherein
   the compound is represented by $\{\{(Ba_pSr_{1-p})_x[(Ca_q)(Gd_s)]_{1-x}\}_m Ti_y(Zr, Hf)_v, Ge_w]_{1-y}O_{3-\delta}\}_n$—$\{\{(Ba_pSr_{1-p})_x[(Ca_q)(Gd_s)]_{1-x}\}_m Ti_y[(Zr, Hf)_v, Ge_w]_{1-y}O_{3-\delta2-\gamma}N_\gamma\}_{1-n}$; and
   x, y, p, q, s, q+s, v, w, v+w, 1-y, m, $\gamma$, 1-n satisfy
   $0.80 \le x \le 0.985$
   $0.80 \le y \le 0.985$
   $0.45 \le p \le 0.69$
   $0 \le q \le 0.15$
   $0 \le s \le 0.10$
   $0 \le q+s \le 0.25$
   $0 \le v \le 0.25$
   $0 \le w \le 0.25$
   $0 \le v+w \le 0.25$
   $0 < 1-y \le 0.25$
   $0.9 \le m \le 1.1$
   $0.001 \le \gamma \le 1.0$
   $0.1 \le 1-n \le 0.9$.

6. A tunable paraelectric variable capacitor comprising:
   a dielectric layer; wherein
   the dielectric layer includes the crystalline perovskite crystalline composite paraelectric material according to claim 1.

7. The tunable paraelectric variable capacitor according to claim 6, further comprising a buffer layer provided on the dielectric layer.

8. The tunable paraelectric variable capacitor according to claim 6, wherein the dielectric layer has a thickness from about 90 nm to about 800 nm.

9. A method for producing an anion-controlled perovskite material, comprising steps of:
   depositing an anion-controlled perovskite material by RF sputtering at about $1 \times 10^{-6}$ Torr to about $5 \times 10^{-3}$ Torr oxygen partial pressure and with nitrogen partial pressure from about $5 \times 10^{-6}$ Torr to about $5 \times 10^{-2}$ Torr, the $N_2/O_2$ gas ratio being within the range of about 5:1 to about 100:1; wherein
   the anion-controlled perovskite material is deposited at about 550° C. to about 750° C. substrate deposition temperatures.

10. A method for producing an anion-controlled perovskite material according to claim 9, wherein the $N_2/O_2$ gas ratio is within the range of about 35:1 to about 60:1.

* * * * *